(12) United States Patent
Fujita

(10) Patent No.: US 7,893,383 B2
(45) Date of Patent: Feb. 22, 2011

(54) BONDING APPARATUS AND METHOD FOR CLEANING TIP OF A BONDING TOOL

(75) Inventor: Kazuo Fujita, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 505 days.

(21) Appl. No.: 11/879,086

(22) Filed: Jul. 16, 2007

(65) Prior Publication Data

US 2008/0023028 A1 Jan. 31, 2008

(30) Foreign Application Priority Data

Jul. 14, 2006 (JP) .............................. 2006-194767

(51) Int. Cl.
*B23K 10/00* (2006.01)

(52) U.S. Cl. .............. 219/121.45; 219/56.1; 219/56.21; 219/121.48

(58) Field of Classification Search ............ 219/121.45, 219/121.46, 121.5, 121.48, 121.51, 56.1, 219/56.21, 56.22
See application file for complete search history.

(56) References Cited

U.S. PATENT DOCUMENTS

| 4,572,772 | A | * | 2/1986 | Peterson ................ 204/192.35 |
| 4,909,427 | A | * | 3/1990 | Plaisted et al. ................ 228/4.5 |
| 5,816,480 | A | * | 10/1998 | Nakamura et al. .......... 228/201 |
| 6,527,027 | B2 | * | 3/2003 | Sugiura et al. .............. 156/389 |
| 6,784,394 | B2 | * | 8/2004 | Nishiura .................. 219/56.22 |
| 2002/0096187 | A1 | | 7/2002 | Kuwata et al. |
| 2006/0076337 | A1 | * | 4/2006 | Brunner et al. ........ 219/145.21 |

FOREIGN PATENT DOCUMENTS

| JP | 2000-340599 | 12/2000 |
| JP | 2002-343599 | 11/2002 |
| JP | 3463043 | 8/2003 |

* cited by examiner

*Primary Examiner*—Mark H Paschall
(74) *Attorney, Agent, or Firm*—DLA Piper LLP (US)

(57) ABSTRACT

A wire bonding apparatus for manufacturing, for instance, semiconductor devices, including a cleaning case in which a microplasma generating section comprised of a plasma torch, which has a plasma nozzle 38 at the end, and capacitive coupling electrodes composed of an outer electrode and an inner electrode is fixed to the bottom of the cleaning case. The plasma nozzle is provided such that its center line is in alignment with the longitudinal center line of the capillary. Microplasma is ejected from below the capillary to clean its tip within the cleaning case. A shutter is provided on the top of the cleaning case and the wasted gas produced as a result of cleaning is exhausted out of the cleaning case through an exhaustion port of the cleaning case.

9 Claims, 15 Drawing Sheets

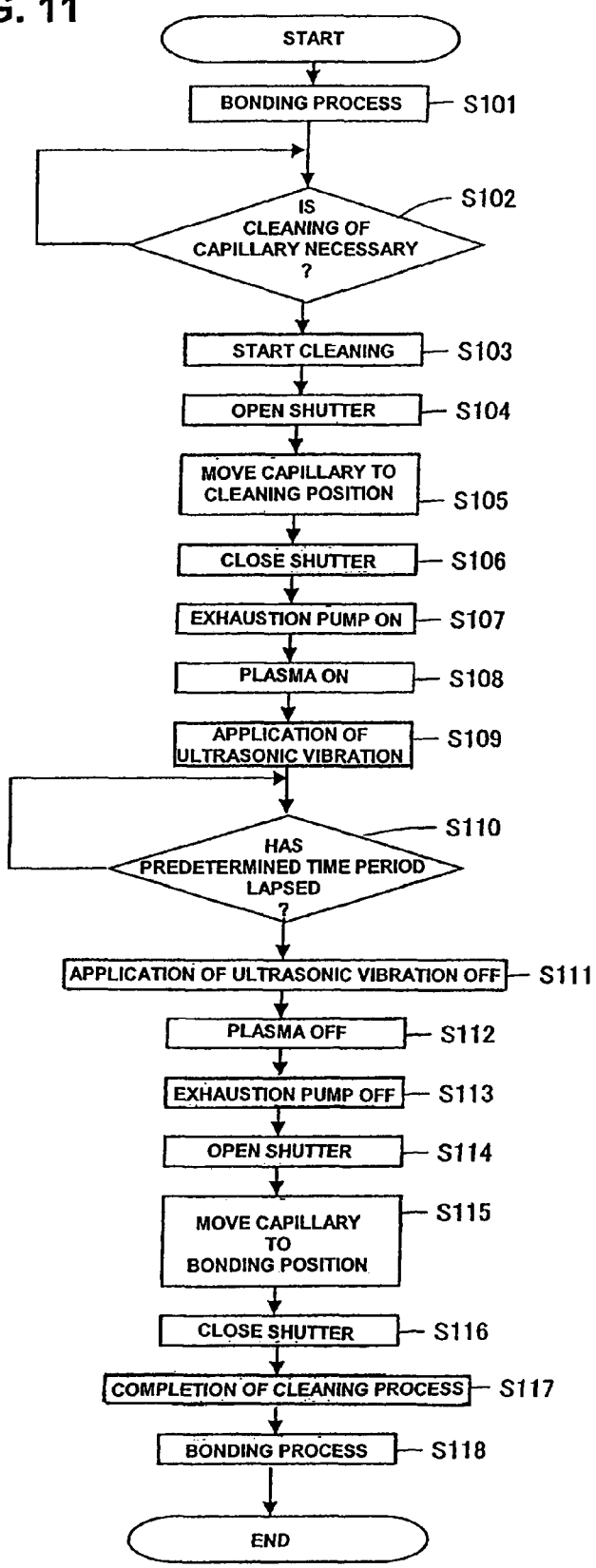

FOREIGN MATERIALS EXIST        NO FOREIGN MATERIALS

BONDING APPARATUS AND METHOD FOR CLEANING TIP OF A BONDING TOOL

BACKGROUND OF THE INVENTION

The present invention relates to a structure of a bonding apparatus and a method for cleaning a tip of a bonding tool installed in the bonding apparatus.

In a process of manufacturing semiconductor devices, a wire bonding apparatus is used for connecting leads of a lead frame with pads of a semiconductor die mounted on the lead frame. When this connection is made, a bonding tool such as a wedge tool, a capillary or the like is used for sequentially pressing metal wires respectively against the pads and their corresponding leads and combining the metal wire with the pads and the leads. In other case, a bump bonding apparatus bonds wires onto bonding pads of a semiconductor chip to form bumps likely as in the case of the wire bonding.

In the bonding apparatus as mentioned above, it is likely that foreign substances attach to the surface of the bonding tool while the bonding operation is repeated for about five hundred thousands of times to one million times. Those foreign substances can cause defects in the bonding.

Conventionally, in case foreign substances attach to a tip of a capillary to cause defects in a bonding, the capillary is exchanged for a new one, or the capillary to which the foreign substances attach is removed from a bonding apparatus and is cleaned with chemical solution such as aqua regia to remove the foreign substance. As it takes time to remove the capillary from the bonding apparatus, a method for cleaning the capillary without removing it from the boding device has been proposed. (refer to, for example, Patent Document 1 (detailed below) Patent Document 1 proposes a bonding apparatus additionally provided with a grinding surface for grinding a tip of a capillary and a cleaning tank containing cleaning solution for cleaning the capillary. When the capillary is cleaned, the capillary 16 from which a gold wire has been removed is pressed against the grinding surface 62 and is vibrated as shown in FIG. 14(a) so that the tip of the capillary is ground. After the grinding of the tip is completed, as shown in FIG. 14(b), a tungsten wire 65 is inserted into the capillary, and the capillary is immersed in the cleaning solution 63 such as alcohol or the like, then the particles 61 generated by the grinding are pushed out with the tungsten wire 65, meanwhile the capillary is cleaned with applying ultrasonic waves to the tungsten wire 65 and the capillary 16 in contact with each other.

On the other hand, in recent years, a surface cleaning technology that uses atmospheric pressure plasma has been proposed. For example, Patent Document 2 (detailed below) discloses a wire bonding apparatus in which a plasma ejecting portion is provided integrally with a wire bonding portion to perform wire bonding after cleaning a contacted surface. The plasma ejecting portion has a concentric double pipe structure including an outer dielectric pipe and inner dielectric pipe. The outer dielectric pipe is provided with a conical electrode which is grounded. The inner dielectric pipe is provided therein with a high frequency electrode of a cylindrical rod shape. A gas such as argon gas is introduced between the outer and inner pipes, and atmospheric glow discharge is caused to generate low-temperature plasma. The plasma generated in that way is emitted from a gas blowout nozzle and exposed onto the electrodes of BAG (ball grid array) substrate to remove the contamination on the electrodes.

Patent Document 3 (detailed below) discloses a plasma generator in which a high frequency coil is provided at a thin tip of a cylindrical plasma torch made of electrical insulating material and a wire extends through the plasma torch; and in this structure, plasma of an extremely small diameter is generated between the high frequency coil and the wire in the plasma torch by means of high frequency electric power.

Patent Document 1: Japanese Patent No. 3463043, which is corresponding to US2002/0096187A1

Patent Document 2: Japanese Patent Application Unexamined Publication Disclosure No. 2000-340599

Patent Document 3: Japanese Patent Application Unexamined Publication Disclosure No. 2002-343599

The foreign substances attaching to the surface of the bonding tool include metallic foreign substances such as gold and silver, and organic foreign substances which are produced by organic substances evaporated and fixed to the surface. The metallic foreign substances attach to the surface when the boding tool rubs a surface of a lead which is plated with gold or silver. The organic foreign substances are produced by that organic components evaporating from the surfaces of a lead frame, BGA substrate or a wire, by the heating at the time of bonding, is cooled at the surface of the bonding tool and attach to and accumulate on the surface as foreign substances.

FIG. 13 shows a tip of a capillary used as a bonding tool. The capillary 16 includes a straight hole 55 at its center through which a wire (bonding wire) is inserted, a chamfer portion 53 for pressing, against a pad or a lead, a ball formed at the end of the wire, and a face portion 54. The face portion 54 is an end surface of the capillary 16 and makes a slight angle with a plane perpendicular to the straight hole 55. The chamfer portion 53 is a tapered hole expanding from the straight hole 55 towards the face portion 54. The corner at the intersection of the chamfer portion 53 and the face portion 54 is arranged to sink into the wire and easily cut the wire when the wire is pressed against a lead. The right half of FIG. 13 shows the capillary at the condition before it is used and where no foreign substance attaches thereto, while the left half of the same shows the capillary after it is used and to which foreign substances have attached. Metallic foreign substances mainly attach to the portion close to the corner at the intersection of the chamfer portion 53 and face portion 54 which rubs the surface of the lead, while organic foreign substances mainly attach to and accumulate on the surface the inner wall of the straight hole 55 and an outer surface of the tip portion of the capillary 16.

The metallic foreign substances mainly attached to the portion close to the corner at the intersection of the chamfer portion 53 and the face portion 54 are liable to make it difficult for the corner to sink into the wire and cause inconvenience in cutting of the wire after bonding process. The organic foreign substances attaching to the surface of the inner wall of the straight hole 55 increase the friction between the wall of the straight hole 55 and the wire so that the wire pulled out of the bonding tool can vary in its length. The organic foreign substances attaching to the outer surface of the capillary 16 can lower the accuracy of positioning in case the capillary is positioned in accordance with an image of the tip of the capillary.

The conventional technology disclosed in Patent Document 1, as FIGS. 14(a) and 14(b) show, can clean the inner wall of the straight hole 55, which is to be made contact with the tungsten wire 65, by removing the foreign substances on the end surface of the capillary 16 and by ultrasonic vibrations in the cleaning solution 63. However, this conventional technology has a problem that it can not effectively remove the foreign substances since the tungsten wire 65 does not make contact with the foreign substances attaching to the inner wall of the chamfer portion 53. Consequently, the inconvenience for cutting the wire after bonding was occasionally caused even though the cleaning was done. In addition, for the cleaning of the capillary 16, this conventional technology requires the bonding apparatus to be stopped once such that a gold wire is removed from the capillary and a tungsten wire 65 of high hardness is inserted thereinto. As a result, this conventional technology has a problem that the cleaning of the capillary 16 cannot be carried out successively together with the bonding process. Especially, as it is often the case that several tens of bonding machines are operated simultaneously, this conventional technology has another problem. It lowers the efficiency of bonding operations since every time the capillaries 16 are cleaned, the bonding machines must be stopped for the removal of the gold wires and for the installation of the tungsten wires 65, and the gold wires must be installed back in the capillaries when the bonding apparatus is returned to the bonding operation.

Patent Document 2 discloses a conventional technology that contamination on an electrode, which is a contacted surface, is removed by plasma, but Patent Document 2 does not refer to the problem caused by attachment and compile of foreign substances on the bonding tool.

Patent Document 3 discloses a plasma generator employing a high frequency coil for the generation of extremely small diameter plasma, but it is silent about the cleaning by plasma.

As discussed above, it is difficult for the conventional technologies to effectively clean the foreign substances that have attached to the tip of the bonding tool. It is also difficult for the conventional technologies to carry out the cleaning of the bonding tool successively during the bonding process.

BRIEF SUMMARY OF THE INVENTION

Accordingly, it is an object of the present invention is to provide a bonding apparatus and method which can effectively clean the foreign substances that have attached to a tip of a bonding tool.

It is another object of the present invention to provide a bonding apparatus and method in which cleaning of boning tool is successively carried out during the bonding process.

The above objects are accomplished by a unique structure of the present invention for a bonding apparatus provided with a boning tool in which a wire is inserted for bonding the wire to a work, and it is characterized in that the bonding apparatus includes a plasma generating section, which has a plasma nozzle of a plasma torch directed to a tip of the bonding tool located at cleaning position to eject plasma state gas and clean the tip of the bonding tool, and a cleaning case, in which the plasma nozzle is arranged and which has an opening for allowing the tip of the bonding tool to enter the cleaning case therethrough and an exhaust port for allowing the waste gas to be exhausted therethrough, so that the tip of the bonding tool is cleaned in the cleaning case.

It is preferable that the bonding apparatus is provided with a shutter for closing the gap between the bonding tool and the opening when the tip of the bonding tool is inserted into the cleaning case through the opening. It is also preferable that the bonding apparatus is provided with a gas exhaustion pump for exhausting after-cleaning gas from the cleaning case through the exhaust port.

In the bonding apparatus of the present invention, the plasma nozzle is preferably arranged to eject plasma state gas toward the tip of the bonding tool in a direction making an angle with respect to the longitudinal axis of the bonding tool. The plasma nozzle can preferably be arranged to rotate around the longitudinal axis of the bonding tool so as to eject the plasma gas from different angular directions along the circumference of the tip of the bonding tool.

The bonding apparatus according to the present invention preferably further includes a vibration applying means for vibrating the tip of the bonding tool, and a bonding control section for controlling the bonding operation and the cleaning operation for the tip of the bonding tool, and the bonding control section includes a vibration applying and cleaning means for vibrating the tip of the bonding tool by means of the vibration applying means and cleaning the tip of the bonding tool by the plasma generating section within the cleaning case.

In addition, the bonding apparatus can further preferably include a clamper opening/closing means for opening and closing each one of a plurality of clamper holding a wire, a moving mechanism for moving the bonding tool in XYZ directions, and a bonding control section for controlling the boding operation and the cleaning operation for the tip of the bonding tool, and the bonding control section includes a wire length adjusting means for adjusting the length of the wire (tail wire extending out of the bonding tool) at the tip of the bonding tool by the up/down movement of the bonding tool caused by the clamper opening/closing means and moving mechanism.

In the bonding apparatus according to the present invention, the plasma generating section can preferably be a capacitive coupling type microplasma generating section in which the electric power is supplied to a cylindrical outer electrode installed concentrically with the central axis of the plasma torch and a inner electrode installed on the central axis of the plasma torch so as to eject, from the plasma nozzle which is at the distal end of the plasma torch, gas which has been converted to a plasma state in the plasma torch. Alternatively, the plasma generating section can be an inductive coupling type microplasma generating section in which the electric power is supplied to a high frequency coil wound around the tip of the plasma torch to eject the gas which has been converted into plasma state in the plasma torch from the plasma nozzle which is at the distal end of the plasma torch.

The above objects are further accomplished by unique steps of the present invention for a cleaning method for cleaning the tip of a bonding tool used in a bonding apparatus that includes a moving mechanism for moving in XYZ directions a bonding tool into which a wire is inserted for bonding the wire to a work; a plasma generating section having a plasma nozzle directed to the tip of the bonding tool located at a cleaning position to eject plasma state gas and clean the tip of the bonding tool; a cleaning case in which the plasma nozzle is arranged and the tip of the bonding tool is cleaned, the cleaning case being provided with an opening for allowing the tip of the bonding tool to enter the cleaning case therethrough and an exhaust port for allowing the waste gas to be exhausted therethrough; and a bonding control section for controlling the bonding operation and the operation for cleaning the tip of the bonding tool, and in the present invention the cleaning method includes a moving step for moving the tip of the bonding tool by the moving mechanism to the cleaning position within the cleaning case, a cleaning step for cleaning the tip of the bonding tool by ejecting the plasma state gas from the plasma nozzle of the plasma generating section, and a returning step for returning the tip of the bonding tool by the moving mechanism to a bonding position which is above the work.

The bonding apparatus can further include a gas exhaustion pump for exhausting wasted gas from the cleaning case through the exhaust port, and in the cleaning step, the tip of the bonding tool is preferably cleaned after the gas exhaustion pump is actuated, and then the gas exhaustion pump is stopped after the completion of the cleaning operation.

In the cleaning method according to the present invention, the bonding apparatus can further include a vibration applying means for vibrating the bonding tool such that, in the cleaning step, the tip of the bonding tool is vibrated by the vibration applying means and cleaned.

In addition, the bonding apparatus can further include a clamper opening/closing means for opening and closing each one of a plurality of clampers which hold a wire, and the cleaning step includes a wire length adjusting step for adjusting the length of the wire (tail wire extending out of the bonding tool) at the tip of the bonding tool by up/down movement of the bonding tool caused by the clamper opening/closing means and moving mechanism.

As seen from the above, the bonding apparatus and method according to the present invention has an advantage that foreign substances attaching to the tip of the bonding tool are effectively removed. The bonding apparatus and method according to the present invention has another advantage that the cleaning of the bonding tool can be carried out successively during the bonding operation.

BRIEF DESCRIPTION OF THE SEVERAL VIEWS OF THE DRAWINGS

FIG. 11 is a flow chart showing the process in which the bonding operation and the cleaning operation are carried out successively in the wire bonding apparatus according to the present invention.

DETAILED DESCRIPTION OF THE INVENTION

Preferred embodiments of the present invention will now be described with reference to the accompanying drawings.

Figure 1:
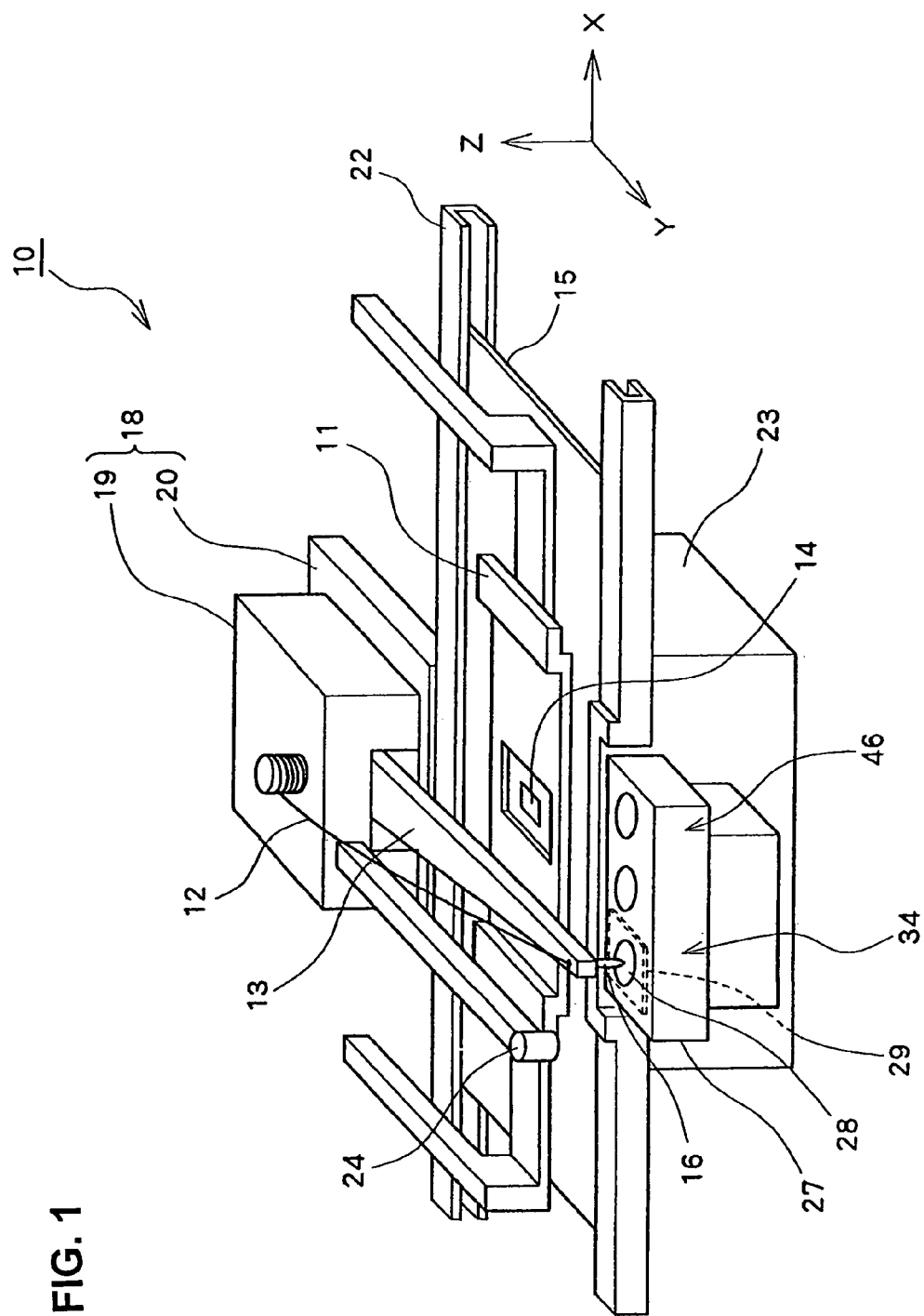
FIG. 1 is a perspective view of a wire bonding apparatus according to one embodiment of the present invention.
Figure 2:
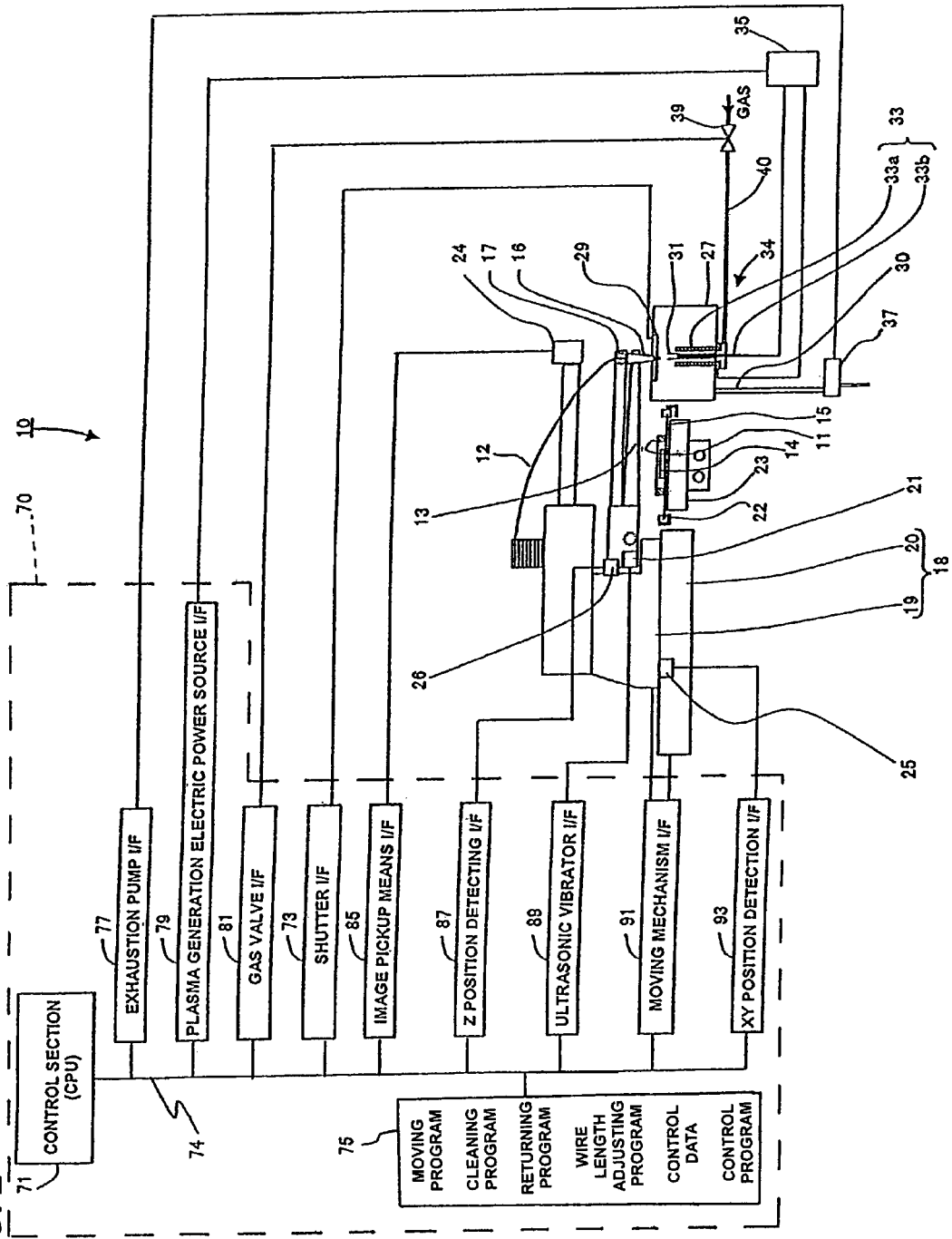
FIG. 2 is an illustration of the device control system for the wire bonding apparatus of the embodiment of the present invention.

Referring to FIG. 1 and FIG. 2, the entire configuration and system configuration as embodiments of the present invention will be described. As shown in FIG. 1, a wire bonding apparatus 10 includes a bonding head 19 mounted on a XY table 20 and provided with a bonding arm 13 of which distal end is driven by a motor in an up and down direction, i.e. Z direction. A capillary 16, which is a bonding tool, is attached to the distal end of the bonding arm 13. The XY table 20 and a bonding head 19 make up a moving mechanism 18 which can move the bonding head 19 to a desired position in a horizontal plane (XY plane) by the XY table 20 and move as desired in XYZ directions the capillary 16 attached to the distal end of the bonding arm 13, by driving the bonding arm 13 mounted on the bonding head 19. A wire 12 is inserted in the bonding arm 13.

A pair of transportation guides 22 for guiding a lead frame 15 are provided on the distal end side of the bonding arm 13 of the XY table 20, and a lead frame 15 on which a semiconductor die 14 is mounted is transported in the X direction by means of the transportation guides 22. The lead frame 15 is held down from above by the frame holder 11 and is absorbed by an absorbing stage 23 below the lead frame 15 such that the semiconductor die 14 mounted on the lead frame 15 is located at a bonding position. The wire bonding apparatus 10 connects the semiconductor die 14 and the lead frame 15 with the wire 12.

A cleaning case 27 for cleaning therein the capillary 16 and a capillary tip image obtaining section 46 for measuring the condition of the tip of the capillary are provided outside of a bonding area which is between the pair of the transportation guides 22. The cleaning case 27 is formed on its top plane with an opening 28 through which the capillary 16 is inserted and with a shutter 29 for opening and closing the opening 28. The cleaning case 27 is also provided with a microplasma generating section 34 for cleaning the tip of the capillary. The cleaning case 27 and capillary tip image obtaining section 46 are located respectively at positions where the tip of the capillary 16 is inserted into them by means of the moving mechanism 18.

As shown in FIG. 2, the microplasma generating section 34 of a capacitive coupling type is mounted in the cleaning case 27. The micro plasma generating section 34 includes a plasma torch 31 located within the cleaning case 27 and made of ceramic material such as alumina or the like; a cylindrical outer electrode 33a installed outside of and concentrically with the plasma torch 31; and an inner electrode 33b installed inside of and on the central axis of the plasma torch 31. The inner electrode 33b can be preferably made of a precious metal having a high melting point for the generation of the plasma and for stabilization. Both electrodes 33a and 33b are connected to a plasma generation power source 35. The plasma torch 31 is connected to a gas pipe 40 for introducing gas for generating plasma, and the gas pipe 40 is connected to a gas valve 39 for the adjustment of the amount of gas flow. Although FIG. 2 does not show, an ignition device for igniting plasma gas is located in the vicinity of the plasma torch 31. To the cleaning case 27 is attached a exhaust port 30 for exhausting the plasma state gas ejected into the cleaning case 27, and the exhaust port 30 is connected to a gas exhaustion pump 37 for absorbing the exhausted gas.

A position detecting camera 24, an image pickup means for confirming the position of the capillary 16, is mounted on the bonding head 19. An ultrasonic vibrator 21 for vibrating the capillary 16 is installed on the proximal end of the bonding arm 13. A Z position detecting means 26 for detecting the height of the capillary 16 based on the rotational angle of the bonding arm 13 is mounted on the turning portion of the bonding arm 13.

The XY table 20 is provided with an XY position detecting means 25 for detecting the position of the tip of the capillary 16 in the XY directions. The XY position detecting means 25 detects XY coordinates of the position of a predetermined portion of the bonding head 19 and detects the XY position of the tip of the capillary 16 by compensating for the distance between the predetermined portion and the tip of the capillary 16 in XY directions. Those XY position detecting means 25 and the Z position detecting means 26 can respectively be of a non-contact type employing an electrically detecting means, an optically detecting means or the like, or it can be of a contact type employing a mechanical detection means. The XY position detecting means 25 can be an XY position sensor which directly detects the position of the tip of the capillary 16 in XY directions so far as the XY position detecting means 25 can detect the position of the tip of the capillary 16 in XY directions. Further, the XY position detecting means 25 can have linear scales.

The moving mechanism 18 is connected to a moving mechanism interface (I/F) 91. The XY position detecting means 25 is connected to an XY position detecting means interface 93. The Z position detecting means 26 is connected to a Z position detecting means interface 87. The position detecting camera 24 is connected to an image pickup means interface 85. The ultrasonic vibrator 21 is connected to an ultrasonic vibrator interface 89. The gas valve 39 is connected to a gas valve interface 81. The shutter 29 is connected to a shutter interface 73. The gas exhaustion pump 37 is connected to a gas exhaustion pump interface 77. Each of the above described interfaces is connected via a data bus 74 to a control section 71 of a computer 70 which controls the bonding operation and cleaning operation of the capillary 16. The control section 71 of the computer 70 includes therein a CPU (central processing unit) for such controls. To the data bus 74 is connected a memory section 75 for storing a moving program for moving the tip of the bonding tool to a cleaning position in the cleaning case by the moving mechanism, a cleaning program for cleaning the tip of the bonding tool by ejecting the plasma state gas from the plasma nozzle of the plasma generating section, a returning program for returning the tip of the bonding tool to a bonding position above the work by the moving mechanism, and the control data and program.

FIGS. 3(*a*) and 3(*b*) show the cleaning case 27 wherein the shutter 29 of the cleaning case 27 is open and the tip of the capillary 16 has been entered in the cleaning position in the cleaning case 27 through the opening 28.

Figure 4:
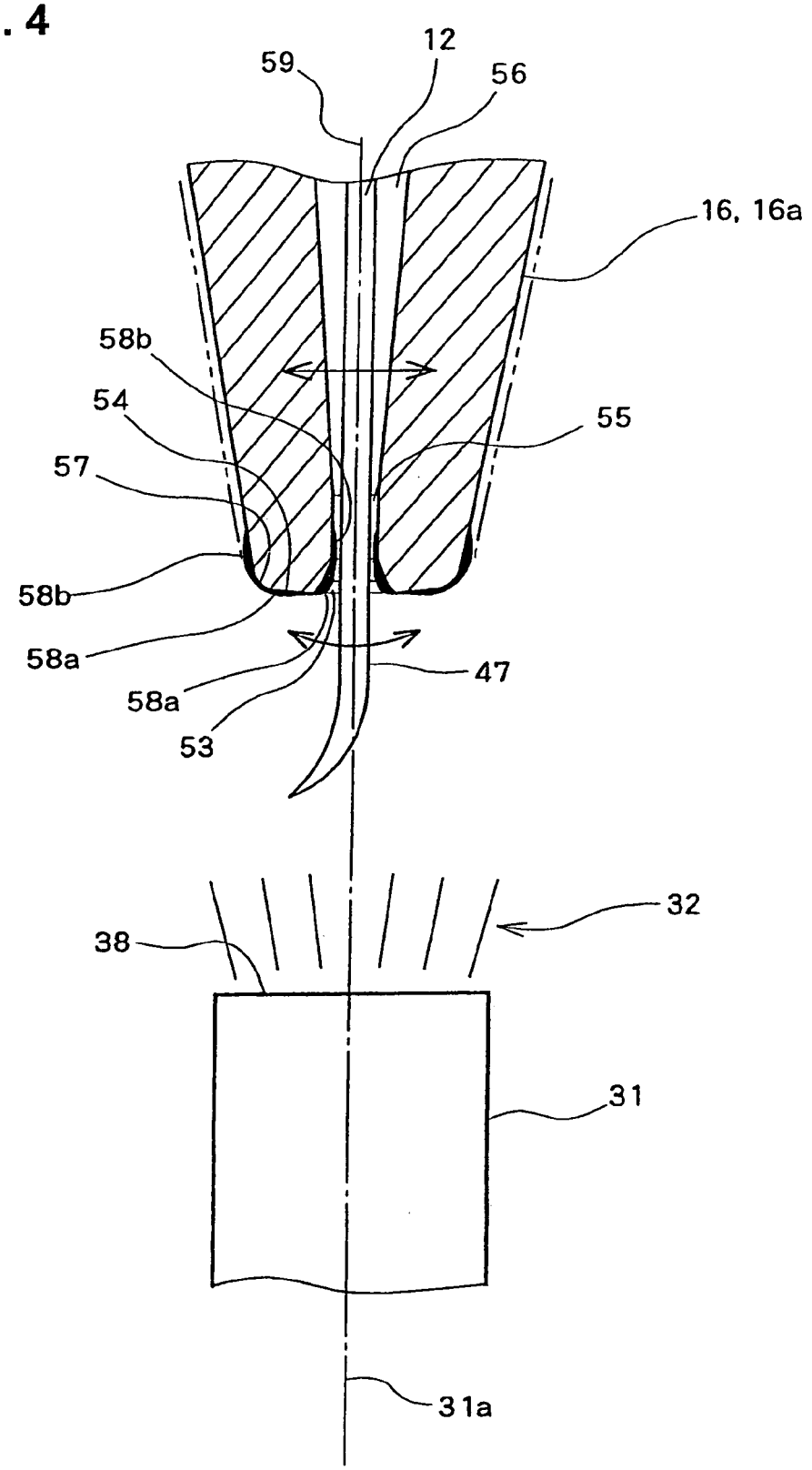
FIG. 4 is an illustration for the explanation of a condition where the tip of a capillary is being cleaned in the wire bonding apparatus of the embodiment of the present invention.

More specifically, in the cleaning case 27, a microplasma generating section 34 comprised of the plasma torch 31, which is formed with a plasma nozzle 38, and capacitive coupling type electrodes 33 composed of the outer electrode 33*a* and inner electrode 33*b*, is fixed on the bottom of the cleaning case 27. The plasma nozzle 38 is provided such that the center line 31*a* of the plasma nozzle is in alignment with the longitudinal center line 59 of the capillary 16 as shown in FIG. 4. The (gas passage within the) plasma torch 31 penetrates through the bottom of the cleaning case 27 and is connected to the gas pipe 40 which is outside of the cleaning case 27. It should be noted that the center line 31*a* of the plasma nozzle cannot be in alignment with the longitudinal center line 59 of the capillary 16 so far as the plasma nozzle 38 is directed to the area where the microplasma 35 is ejected from below the tip of the capillary 16 to a chamfer portion 53, a straight hole 55, a face portion 54, an outer radius portion 57 of the capillary tip portion 16*a* and an outer surface of the capillary tip portion 16*a* extending from the outer radius portion 57. For example, the plasma nozzle 31 can be arranged such that its center line 31*a* is directed to the intersection of the end portion of the chamfer portion 53 and the end surface of the capillary 16. The center line of the plasma nozzle 31*a* can otherwise preferably be directed to some point on the face portion 54 or on the surface of the capillary tip portion 16*a*. In this case, the cleaning position for the capillary 16 is at a position where the surface of the capillary tip portion 16*a* and the center line 31*a* of the plasma nozzle intersect each other and the distal end of the capillary 16 is distant from the plasma nozzle 38 for a predetermined distance.

In the present embodiment, the inner diameter of the plasma nozzle 38 is approximately equal to the size of the tip of the capillary 16 and the diameter can be 200 to 300 μm, for example. The size of the inner diameter of the plasma nozzle 38 can be larger than that, for example 500 to 700 μm, or can be smaller, for example less than 100 μm. The distance between the plasma nozzle 38 and the distal end of the capillary 16 is arranged such that the tip of the capillary 16 can be cleaned by plasma ejected from the plasma nozzle 38, and in the present embodiment, for example, the distance is 500 to 600 μm which is two to three times of the inner diameter of the plasma nozzle. This distance can be determined in accordance with the length of the plasma generating section, the intensity of the generated plasma, the kind of gas to be used, and so forth. The shutter 29 installed in the upper position of the cleaning case 27 is composed of a plane plate which is slid by a moving mechanism of shutter (not shown) along a guide provided on the upper position of the cleaning case 27. When the shutter 29 is closed, the opening 28 of the cleaning case 27 is closed; and when the shutter 29 is open, the opening 28 appears. The size of the opening 28 is larger than the size (diameter) of the capillary 16.

Referring to FIGS. 3 and 4, description will be made on the cleaning operation for cleaning the capillary tip portion 16*a* located at the cleaning position. FIG. 4 is an enlarged view of the capillary tip portion 16*a* and the plasma torch 31.

The capillary 16 includes a straight hole 55 formed at its center to allow the wire 12 to be inserted thereinto, a chamfer portion 53 for pressing a ball formed at the end of the wire against a pad or a lead, and face portion 54. The face portion 54 is an end surface of the capillary 16 and makes a slight angle with respect to a plane perpendicular to the center line of the capillary 16. The face portion 54 is smoothly connected to the outer surface of the capillary 16 by the outer radius portion 57. The chamfer portion 53 is a tapered hole expanding from the straight hole 55 toward the face portion 54. The capillary tip portion 16*a* means a portion of the capillary including the chamfer portion 53, the face portion 54, the straight hole 55, the outer radius portion 57 and the outer surface of the tip of the capillary 16 extending from the outer radius portion 57. When the wire 12 is inserted into the capillary 16, a tail wire 47 extends out of the end of the capillary 16. The tail wire 47 curves toward its end and is tapered to be smaller in diameter toward its end. A gap is formed between the wire 12 and the straight hole 55. As shown in FIG. 4, metallic foreign substances 58*a* attach mainly to the chamfer portion 53 which rubs the surface of a lead and to a portion close to the corner at the intersection of the chamfer portion 53 and the face portion 54, while organic foreign substances 58*b* attach to and accumulate on mainly the inner wall of the straight hole 55 and the outer surface of the capillary tip portion 16*a*. Due to the organic foreign substances 58*b* attaching to the inner wall of the straight hole 55, the clearance between the wire 12 and the straight hole 55 becomes small.

The cleaning of the foreign substances that have attached and compiled as mentioned above is made as described below.

First, gas for plasma generation is introduced into the plasma torch 31 via the gas pipe 40. The gas can be inert gas such as argon gas, helium gas, neon gas, krypton gas, or the like or nitrogen gas. When a lot of organic foreign substances attach to the capillary tip portion 16*a*, an oxygen gas can be added to remove the carbon component in the foreign substances in the form of carbon dioxide by combining the carbon with the oxygen. When the foreign substances 58 are removed by reduction process, hydrogen, for instance, can be added.

The gas flowing into the plasma torch 31 begins to flow out into the cleaning case 27 through the plasma nozzle 38 at the end of the plasma torch 31.

Then the plasma generation power source 35 is controlled to supply appropriate high frequency current across the outer electrode 33*a* and the inner electrode 33*b* and a plasma ignition device (not shown) is actuated to ignite the gas. When the high frequency power supplied across the electrodes and the conditions of the gas within the plasma torch 31 are appropriate, microplasma is generated in the gas that has flown into the plasma torch 31, by means of the high frequency power. The high frequency current has a frequency of, for example, 400 to 500 MHz. The generated microplasma ejects from the plasma nozzle 38 at the end of the plasma torch 31. The microplasma 32 ejecting from the plasma nozzle 38 becomes a jet shooting toward the capillary tip portion 16*a* to which the nozzle is directed.

As mentioned above, the metallic foreign substances mainly attach to the chamfer portion 53 of the capillary tip portion 16*a* and the face portion 54. The ejected microplasma 32 is directly ejected to the face portion 54 and chamfer portion 53, and the metallic foreign substances 58*a* are removed by the collision of the microplasma 32 against the metallic foreign substances. The foreign substances 58*b* on the outer surface of the capillary tip portion 16*a* are also removed in the same way by the collision of the microplasma 32 against the foreign substances. As the microplasma 32 is blown full blast, the microplasma 32 can blow into the straight hole 55 of the capillary tip portion 16*a* to effectively remove the organic foreign substance 58*b* on the wall of the straight hole 55 of the capillary tip portion 16*a* even though the wire 12 is in the condition inserted in the capillary 16.

Vibration can be applied to the capillary 16 during the cleaning process. When vibration is applied to the capillary 16 by the ultrasonic vibrator 21 during the cleaning process, the capillary 16 itself vibrates to shake off the foreign substances. When the ultrasonic vibration is applied to the capillary 16, as shown in FIG. 4, the capillary itself vibrates by the vibration in the back and forth direction of the bonding arm 13, and at the same time, the tip of the capillary 16 vibrate as if it shakes its head back and forth. Such a very small movement of the capillary tip portion 16*a* shifts the angle and position with and at which the microplasma impinge on the face portion 54, the chamfer portion 53, the straight hole 55, the outer radius portion 57 of the capillary tip portion 16*a* and the outer surface of the tip of the capillary 16 extending from the outer radius portion 57; accordingly, the microplasma 32 can be impinged on the portions which are behind or in the shadow of the tail wire 47 or the wire 12 passing in the straight hole 55 and to which the microplasma cannot impinge directly, thereby effectively removing the foreign substances 58.

A part of the foreign substances 58 removed from the capillary tip portion 16*a* by cleaning scatters in the cleaning case 27 in the form of gas such as the carbon dioxide, while the very small particles of foreign substances 58 removed in solid state scatter in the cleaning case 27 along with the gas. The after-cleaning gas scattering in the cleaning case 27 is exhausted by the gas exhaustion pump 37 through the exhaust port 30 as wasted gas. The gas exhaustion pump 37 cannot be of such a large size to cause a negative pressure in the cleaning case 27, but can be of the size not to allow the after-cleaning gas scattering in the cleaning case 27, the removed small particles of foreign substance 58 and the gas to flow out of the cleaning case 27 through the opening 28. Consequently, deterioration in the bonding quality that would occur by the dispersing of the removed foreign substances into the bonding area is prevented. It should be noted that the gas exhaustion pump 37 can be dispensed with in case the foreign substances are, due to the speed and quantity of the plasma gas, not likely to disperse to the outside of the cleaning case through the opening 28.

When the cleaning is completed, the capillary 16 is returned to the bonding area, which is between the transportation guides 22, by means of the moving mechanism 18. As the cleaning is performed with the wire 12 being inside the capillary 16, the capillary 16 can successively carry out the ordinary bonding process immediately after it returns to the bonding area. When the cleaning is completed, the shutter 29 of the cleaning case 27 closes to protect the microplasma generating section 34 including the minute plasma nozzle 38. Although the present embodiment includes the shutter 29 for opening and closing the opening 28 of the cleaning case 27, the shutter 29 can be dispensed with when the cleaning case 27 is able to sufficiently protect the microplasma generating section 34 without the shutter 29.

As described above, in the wire bonding apparatus 10 according to the embodiment of the present invention, the microplasma 32 is ejected toward the capillary tip portion 16*a* so that even the foreign substances 58 attaching to the chamfer portion 53 at the end of the capillary 16 can be effectively removed and cleaned. The embodiment also has an advantage that the microplasma 32 is blown into the straight hole 55 to effectively clean the inner wall of the straight hole 55 of the capillary tip portion 16*a* even though the capillary 16 is cleaned with the wire being inserted therein. In this embodiment, since the capillary 16 is vibrated by the ultra sonic vibrator 21, the angle in which the microplasma 32 impinges on the capillary changes to enable the microplasma 32 to impinge on the surface of the capillary tip portion 16*a* uniformly, thereby cleaning the capillary tip portion 16*a* effectively.

In addition, in the wire bonding apparatus 10 of the present embodiment, the cleaning case 27 is located at the cleaning position where the end portion of the capillary 16 can enter into the cleaning case 27 by the moving mechanism 18 so that the capillary 16 can be moved to the cleaning position by the ordinary moving mechanism even during the bonding process. Furthermore, the capillary 16 can be cleaned without removing the wire therefrom. Thus, the bonding apparatus 10 of the embodiment is advantageous in that the cleaning of the capillary can be performed successively in the bonding process.

Further, as the cleaning is performed within the cleaning case 27 in the present embodiment, the bonding apparatus 10 of the embodiment is advantageous in that the foreign substances 58 are prevented from dispersing by cleaning into the bonding area between the transportation guides 22, thereby preventing contamination of the bonding apparatus due to the cleaning.

Figure 5A:
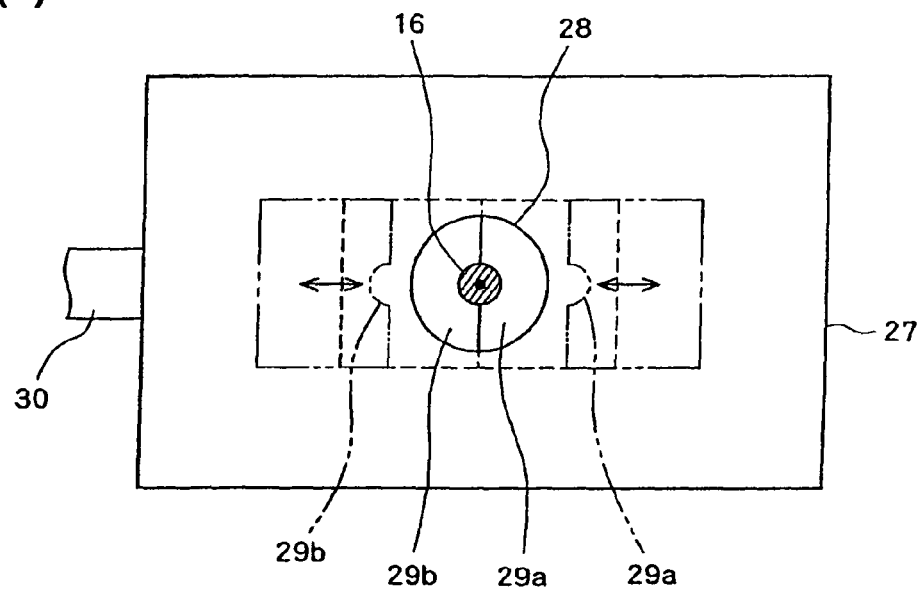
FIGS. 5(a) and 5(b) illustrate other types of the shutter of the cleaning case of the wire bonding apparatus according to the embodiment of the present invention.
Figure 5B:
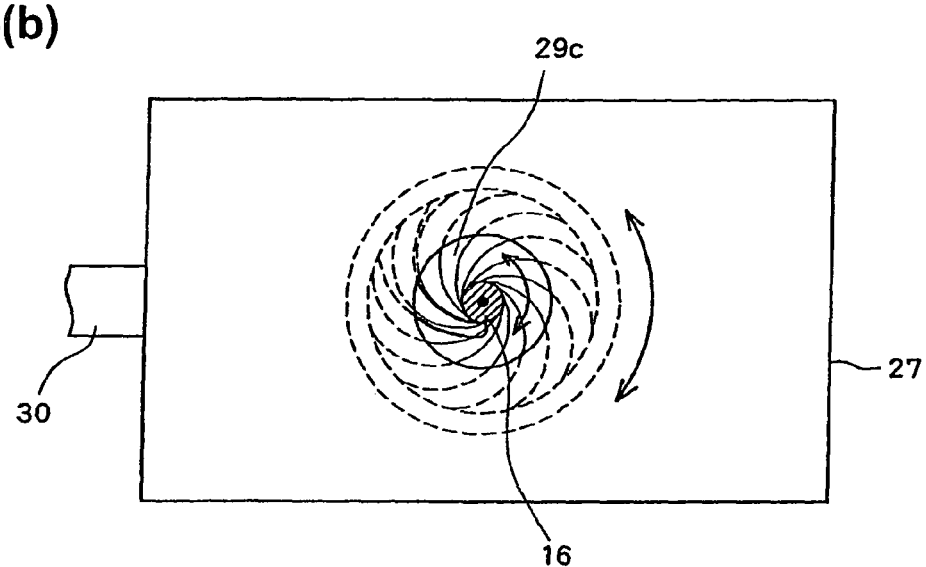

FIGS. 5(a) and 5(b) show other types of the shutter 29 provided on the cleaning case 27. As shown in FIGS. 5(a) and 5(b), the shutter 29 is closed up to the outer surface position of the capillary 16 during the cleaning to close the gap between the capillary 16 and the opening 28.

The shutter shown in FIG. 5(a) is comprised of a pair of shutter plates 29a and 29b arranged at right and left sides to slide laterally and each being formed with a semicircular opening of a diameter which is approximately equal to the diameter of the capillary 16.

The shutter shown in FIG. 5(b) is comprised of a plurality of shutter plates 29c in the form of blades which are partially overlapped with one another in the circumferential direction like a diaphragm of a camera objective lens and which are turned to enlarge or reduce the opening formed thereby at the center, and it is possible for the shutter plates 29c to have the opening 28 of the cleaning case 27 appeared and enable the size of the opening at the center of the shutter to be of the diameter fitted to the outer diameter of the capillary 16. The structure of the shutter is not limited to that as described above so far as it can be closed to the outer surface position of the capillary 16 during the cleaning and can close the gap between the capillary 16 and the opening 28, and the shutter can be configured to close the opening by three or four shutter plates or can be configured to leave some gap between the shutter and the outer diameter of the capillary as the case can be.

Further, the shutter 29 can be installed outside of the cleaning case 27 instead of installing it inside the cleaning case 27 as in the above-described embodiment.

The above-described embodiment is advantageous in that disperse of foreign substances from the cleaning case 27 is further reduced and that contamination of the bonding apparatus 10 due to the cleaning is further reduced.

Figure 3A:
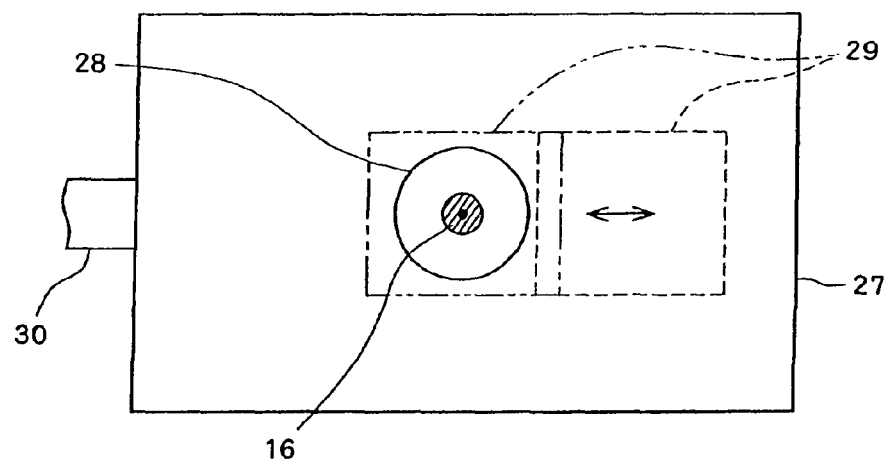
FIG. 3(a) is top view of the cleaning case, including one type of shutter and one type of a microplasma generating section therein, of the wire bonding apparatus of the embodiment of the present invention in the condition that a capillary is at the cleaning position, FIG. 3(b) being a cross-sectional view of the same.
Figure 3B:
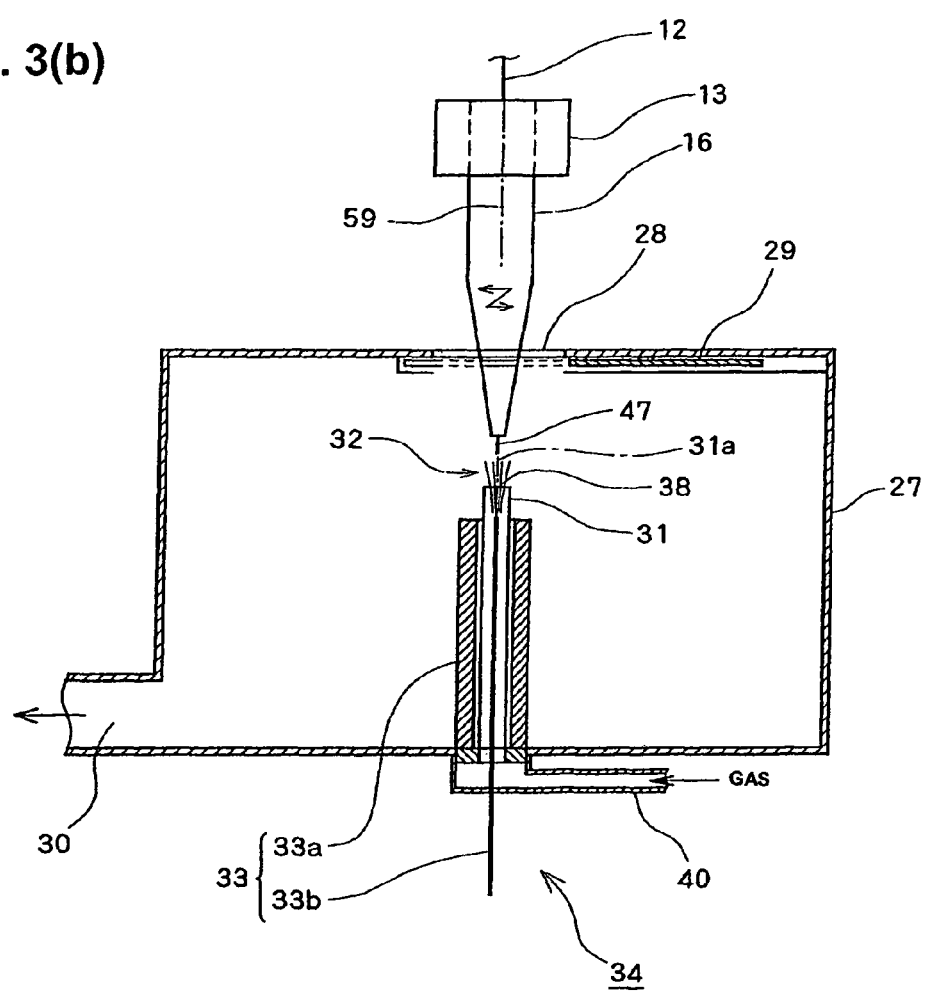
Figure 6:
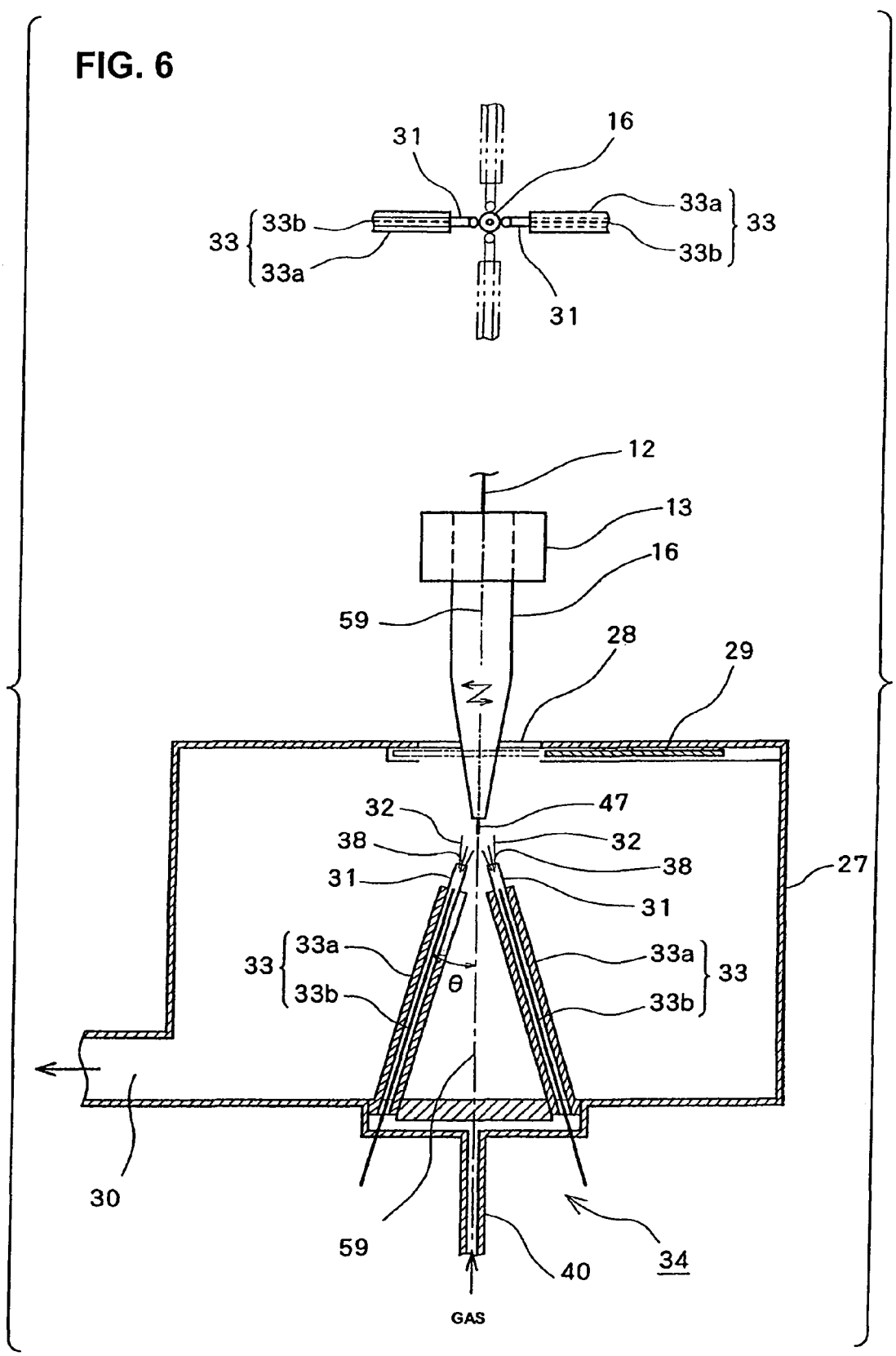
FIG. 6 is a cross-sectional view of a cleaning case with the capillary being at the cleaning position in a wire bonding apparatus according to another (the second) embodiment of the present invention, including a top view of a plurality of plasma torches and plasma nozzles used in the cleaning case.
Figure 7:
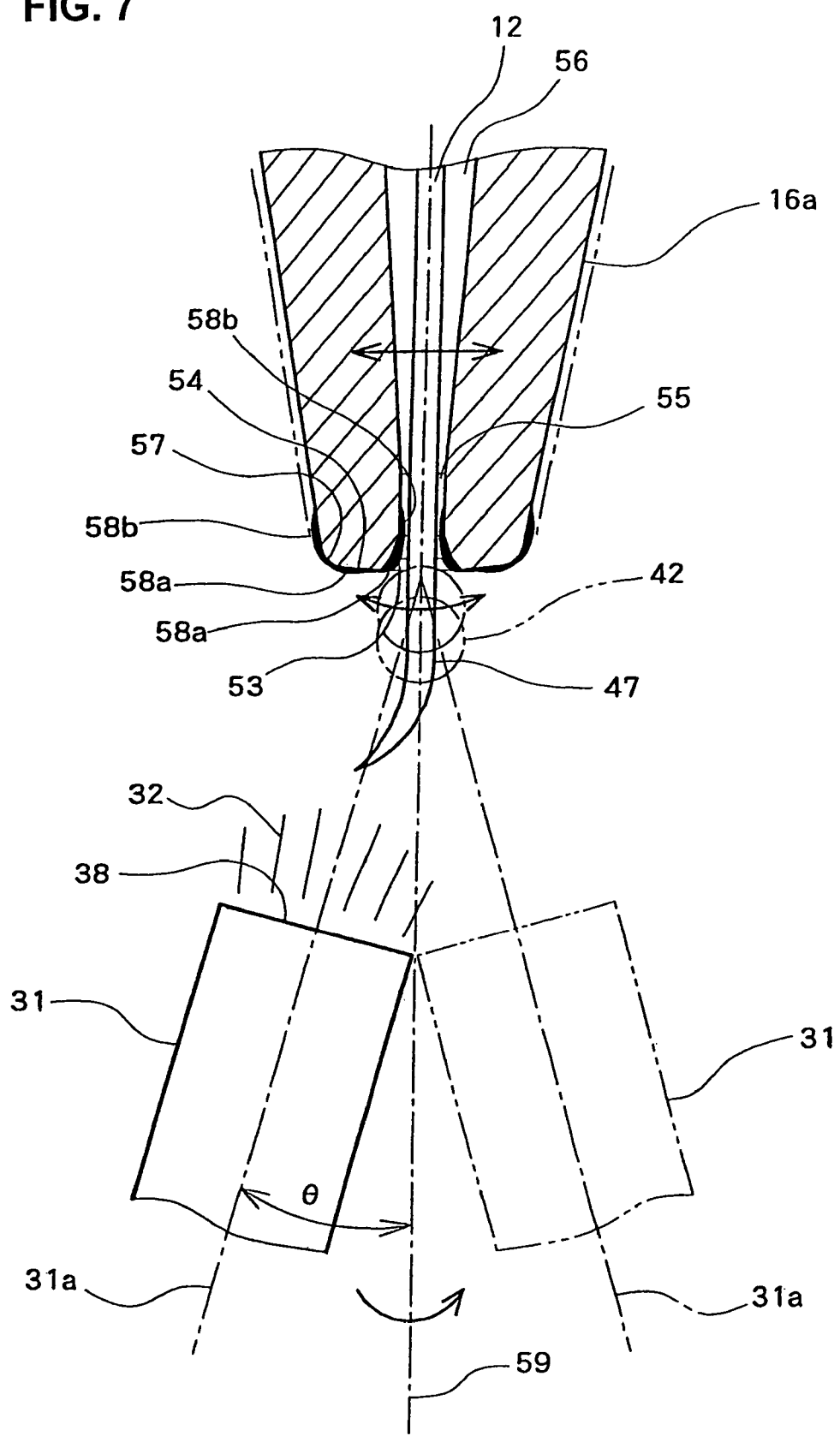
FIG. 7 illustrates the condition where the tip of the capillary is being cleaned in the second embodiment of the wire bonding apparatus of the present invention.

A second embodiment of the present invention will now be described with reference to FIGS. 6 and 7. In FIGS. 6 and 7, components or parts that are the same as or similar to those of the embodiment shown in FIGS. 3(a) and 3(b) are denoted by the same reference numerals or marks, and the explanation of them is omitted.

As seen from FIG. 6, in the structure of the second embodiment, a plurality of plasma torches 31 each having a plasma nozzle 38 are provided, and it further includes capacitive coupling electrodes 33 composed of an outer electrode 33a and an inner electrode 33b; and each plasma nozzle 38 is arranged such that the center line 31a of the plasma nozzle 38 is directed to the intersection of the longitudinal center line 59 of the capillary 16 and the end plane of the capillary. With this arrangement, the microplasma 32 is ejected from below the capillary tip portion 16a in slanting direction to the chamfer portion 53, the straight hole 55, the face portion 54, the outer radius portion 57 of the capillary tip portion 16a and the outer surface of the tip of the capillary 16 extending to the outer radius portion 57.

The angle made by the center line 31a of each of the plasma nozzle 38 (or the plasma torch) and the longitudinal center line 59 of the capillary 16 is θ. The center line 31a of the plasma nozzle 38 is preferably deflected from the intersection of the longitudinal center line 59 of the capillary 16 and the end plane of the capillary so far as the plasma nozzle 38 can eject the microplasma 32 from below the capillary tip portion 16a in slanting direction to the chamfer portion 53, the straight hole 55, the face portion 54, the outer radius portion 57 of the capillary tip portion 16a and the outer surface of the tip of the capillary 16 extending to the outer radius portion 57. For example, each plasma nozzle 38 can preferably be provided such that its center line 31a is directed to the end of the intersection of the chamfer portion 53 and the end surface of the capillary 16, or the center line 31a can be directed to some point on the face portion 54 or some point on the surface of the capillary tip portion 16a.

Further, it is preferable that the plasma nozzle center lines 31a of the plurality of plasma torches 31 are arranged to be directed to the same point, and it is also preferable that the plasma nozzle center lines 31a of the plurality of plasma torch 31 are arranged to be directed to different points. In this case, the cleaning position for the capillary 16 is a position in the cleaning case 27 where the surface of the capillary tip portion 16a and the plasma nozzle center lines 31a intersect and the distal end of the capillary 16 is distant from the plasma nozzle 38 by a predetermined distance.

The plurality of plasma torches 31 and capacitive coupling electrodes 33 thereof are respectively fixed on the bottom of the cleaning case 27 in tilted postures. The (gas passages within the) plasma torches 31 penetrates through the bottom of the cleaning case 27 and are connected to a gas pipe 40 through a common gas header which is outside of the cleaning case 27.

The number of the plasma torches 31 is two in the shown embodiment noted by solid lines in FIG. 6, and it can be four in total with added two torches as shown by two-dot chain lines or even can be three. The torches 31 are not limited to those as shown in FIGS. 6 and 7 so far as they are allocated to surround the circumference of the capillary tip portion 16a and can uniformly emit the microplasma 32 from the surrounding to the straight hole 55 at the center of the capillary 16 and the chamfer portion 53.

In the second embodiment, the inner diameter of each one of the plasma nozzles 38 is about the same as the diameter of the capillary tip portion 16a and is 200 to 300 μm, for example. Instead, the plasma nozzles 38 having the inner diameter of less than 100 μm can be also employed and arranged to eject microplasma 32 aiming respectively at the chamfer portion 53, the straight hole 55 and face portion 54 in a pin point manner.

As shown in FIG. 7, the cleaning is performed with the micro plasma 32 being ejected from each plasma nozzle 38 to the capillary tip portion 16a. In the second embodiment, the microplasma 32 is ejected from different directions around the circumference of the capillary tip portion 16a so that the foreign substances 58 on the chamfer 53 and the inner wall of the straight hole 55 of the capillary tip portion 16a are removed more effectively than by the first embodiment even if the (tail) wire 47 or the ball 42 projects from the end of the capillary 16 to block the jet stream of the microplasma 32.

Figure 8:
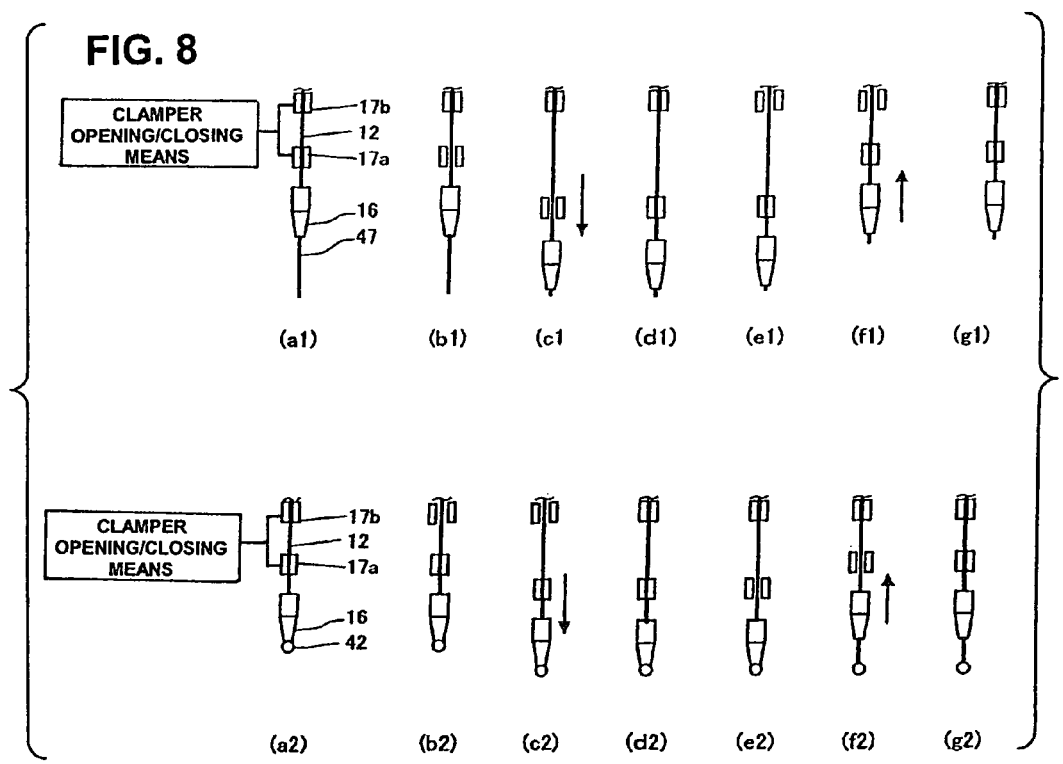
FIG. 8 illustrates a method for adjusting the length of a tail wire at the tip of the capillary ((a1) through (g1)) and the positions of a ball ((a2) through (g2)) in the wire bonding apparatus according to the embodiment of the present invention.

In a bonding apparatus with a plurality of clampers 17a and 17b provided as shown in FIG. 8, the positions of the tail wire 47 and the ball 42 at the end of the distal capillary 16 can be adjusted to reduce the portions which are behind the tail wire 47 or the ball 42 at the distal end of the capillary 16 and onto which the microplasma cannot directly impinge. As shown in FIG. 8, the lengths for which the tail wire 47 and the ball 42 projecting from the distal end of the capillary 16 are adjusted by opening and closing the first and second clampers 17a and 17b by a clamper opening/closing means and by the up/down movement of the capillary 16 and first clamper 17a.

When the end portions of the tail wire 47 and the ball 42 are to be retracted, the first clamper 17a is opened under the condition that both the first and second clampers 17a and 17b are closed as shown in (a1) through (g1) in FIG. 8. Then, while the wire 12 is clamped by the second clamper 17b, the capillary 16 and the first clamper 17a are moved downward and stopped at desired positions. Next, the first clamper 17a is closed and second clamper 17b is opened, and the capillary 16 and the first clamper 17a are moved upward. Then, as the wire 12 is cramped by the first clamper 17a, it moves up along with the capillary 16 so that the tail wire 47 and the ball 42 at the end of the capillary are retracted from the end of the capillary 16.

In contrast, when the end portions of the tail wire 47 and the ball 42 are to be extended forward (or extended out of the capillary), the second clamper 17b is opened under the condition that both of the first and second clampers 17a and 17b are closed as shown in (a2) through (g2) of FIG. 8. The first clamper 17a clamping the wire 12 is moved downward along with the capillary 16, and they are stopped at desired positions, and the wire 12 is pulled out by the first clamper 17a. Then the second clamper 17b is closed and the first clamper 17a is opened to and the capillary 16 and the first clamper 17a are moved upward. Then the wire 12 cramped by the second clamper 17b extends out of the distal end of the capillary 16.

In this way, the second mentioned embodiment is advantageous in that the length of the tail wire 47 extending out of the bonding tool and the position of the ball 42 are adjusted before the capillary tip is set to the cleaning position so that portions hidden behind the tail wire 47 or the ball 42 are reduced and the foreign substances 58 on the chamfer portion 53 and the inner wall defining the straight hole 55 of the capillary tip portion 16a are effectively removed by the microplasma 12.

Figure 9:
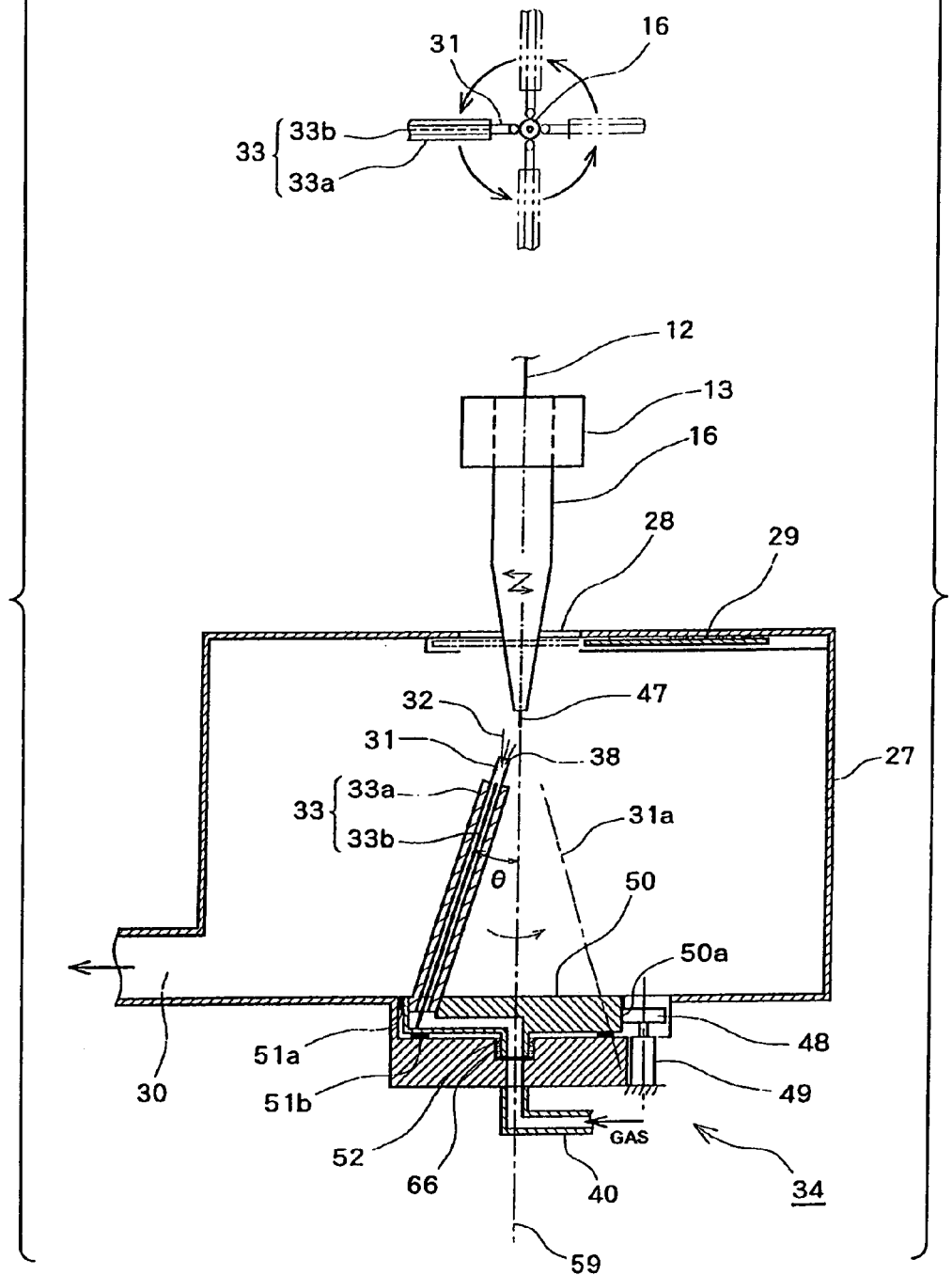
FIG. 9 is a cross-sectional view of a cleaning case with the capillary being at the cleaning position in the wire bonding apparatus according to still another (the third) embodiment of the present invention, including a top view of a plasma torch and plasma nozzle rotatable in the cleaning case.

FIG. 9 shows a third embodiment of the present invention. In FIG. 9, the components or parts that are the same as or similar to those of the embodiment shown in FIGS. 6 and 7 are denoted by the same reference numerals or marks, and the explanation of them is omitted.

As shown in FIG. 9, the microplasma generating section 34 is fixed on a rotary base plate 50 which in turn is installed on the bottom surface of the cleaning case 27. The plasma nozzle 38 is arranged such that its center line 31a is directed to the intersection of the longitudinal center line 59 of the capillary 16 and the end plane of the capillary 16. The angle made by the center line 31a of the plasma nozzle (or the plasma torch 31) and the longitudinal center line 59 of the capillary 16 is θ. The rotary base plate 50 rotates around the longitudinal center line 59 of the capillary 16. With this arrangement, the microplasma 32 is ejected to the capillary tip portion 16a from below in the slanted direction all around the capillary tip portion 16a.

The center line 31a of the plasma nozzle can preferably be deflected from the intersection of the longitudinal center line 59 of the capillary 16 and the end plane of the capillary so far as the plasma nozzle 38 can eject the microplasma 32 from below the capillary tip portion 16a in slanting direction, to the chamfer portion 53, the straight hole 55, the face portion 54, the outer radius portion 57 of the capillary tip portion 16a and the outer surface of the tip of the capillary 16 extending to the outer radius portion 57. For example, the plasma nozzle 38 can preferably be arranged such that its center line 31a is directed to the intersection of the end of the chamfer portion 53 and the end surface of the capillary 16, or the center line 31a can be directed to some point on the face portion 54 or some point on the surface of the capillary tip portion 16a. In this case, the cleaning position for the capillary 16 is a position in the cleaning case 27 where a surface of the capillary tip portion 16a and the plasma nozzle center line 31a intersect and the distal end of the capillary 16 is distant from the plasma nozzle 38 by a predetermined distance. In this case, the plasma torch 31 fixed on the rotary base plate 50 rotates around the longitudinal center line 59 of the capillary 16, and the rotational axis of the rotary base plate cannot be coincident with the longitudinal center line 59 of the capillary.

The rotary base plate 50 is supported by a rotary bearing 66 which is fixed to the outside bottom portion of the cleaning case 27. The rotary base plate 50 is formed therein with a gas passage for introducing gas to the plasma torch 31, and the gas passage is formed to introduce the gas to the gas passage formed at the center of the rotary bearing 66. The gas inlet portion of the rotary base plate 50 is rotatably fitted in the rotary bearing 66 and is sealed around its circumference by a gas seal 52 provided around its outer circumference such that the gas introduced through the gas pipe 40 is introduced into the plasma torch 31 without leaking into the cleaning case 27. On the upper surface of the rotary bearing 66 is mounted an electrode shoe 51a adapted to supply electric power by making contact with the outer electrode 33a and an electrode shoe 51b adapted to supply electric power by making contact with inner electrode 33a. The rotary base plate 50 is formed with a rotary base plate gear 50a on its outer circumference plane which engages a drive gear 48 which in turn is driven by a motor 49. Thus, the microplasma generating section 34 is driven and rotated by the motor 49 along with the rotary base plate 50.

According to the third embodiment having the configuration as described above, the plasma torch 31 rotates around the capillary 16 while ejecting microplasma 32 from the plasma nozzle 38 to the capillary tip portion 16a with an angle θ.

The third embodiment is advantageous in that as the plasma torch 31 is rotated around the circumference of the capillary 16 while the microplasma 32 is being ejected from below in slanted direction of the capillary tip portion 16a to the chamfer portion 53, the straight hole 55, the face portion 54, the outer radius portion 57 of the capillary tip portion 16a and the outer surface of the tip of the capillary 16 extending to the outer radius portion 57, the foreign substances 58 on the chamfer portion 53 and the inner wall defining the straight hole 55 of the capillary tip portion 16a are removed more effectively than the embodiments described before. In addition, when the cleaning is done, the third embodiment is advantageous in that it can employ application of ultrasonic vibration to the capillary 16 and adjustment of the length of the tail wire 47 extending out of the bonding tool and the position of the ball 42, thereby cleaning the foreign substances 58 on the capillary tip portion 16a can be done even more efficiently.

Figure 10:
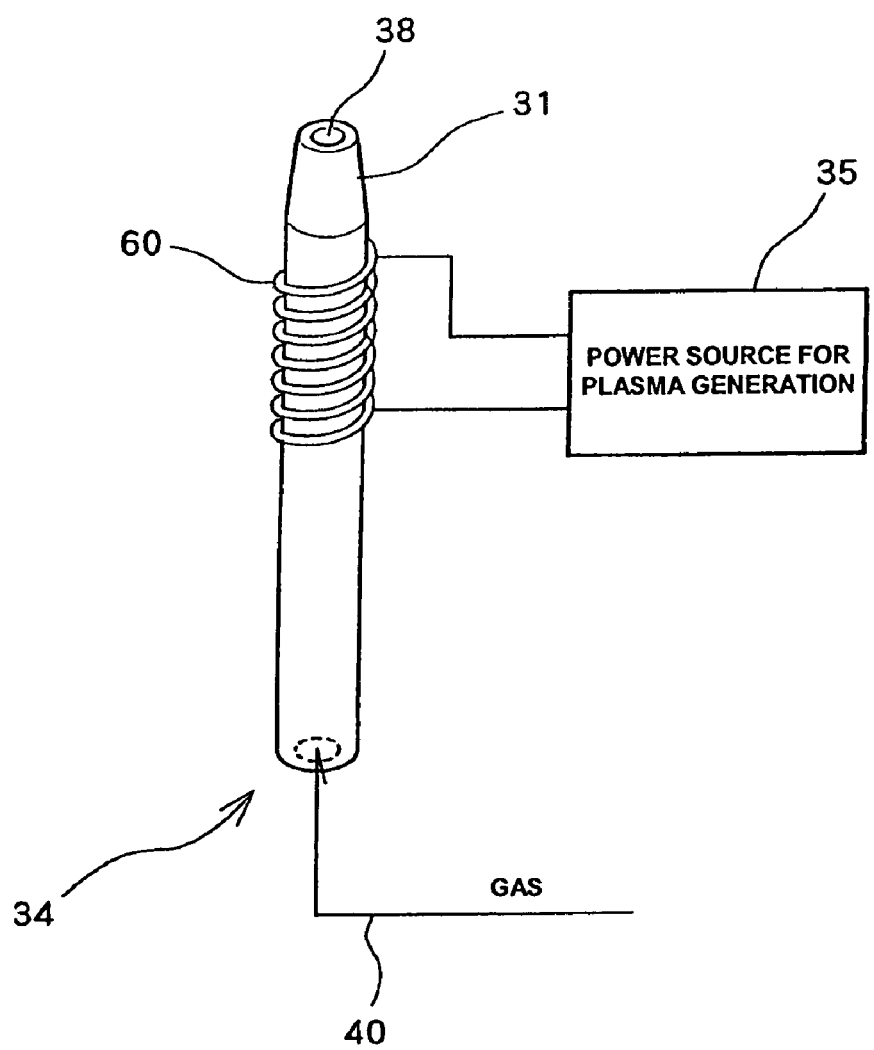
FIG. 10 is a perspective view of another type of a microplasma generating section in the wire bonding apparatus according to the present invention.

FIG. 10 shows another type of the microplasma generating section which can be employed by each of the embodiments described above. FIG. 10 shows entire configuration of the alternative embodiment of the microplasma generating section 34.

The microplasma generating section 34 is comprised of a plasma torch 31, a gas pipe 40 for supplying gas into the plasma torch 31, and a high frequency plasma generation power source 35 as mentioned above. The plasma torch 31 is adapted to eject microplasma 32 from a plasma nozzle 38 at its distal end, and a high frequency coil 60 is wound around the outer circumference of the plasma torch 31 so as to be close to the distal end of the plasma torch 31. The inner diameter of the distal end of the plasma torch can be 50 to 60 μm or 200 to 300 μm likely as in the case of the above-described capacitive coupling type microplasma generating section 34 or can be about 700 μm. The plasma torch 31 can be made of ceramics such as alumina or the like.

The high frequency coil 60 is formed by a conductor wound by several turns on the plasma torch 31. Although not shown in FIG. 10, an ignition device for the plasma ignition is provided in the vicinity of the high frequency coil. The gas used for generating the plasma can be inert gas such as argon like in the case of capacitive coupling type microplasma generating section 34. Oxygen, hydrogen or the like can be added depending on the nature of the foreign substance 58.

In order to generate the microplasma 32, appropriate high frequency electric power is supplied to the high frequency coil 60 after the gas is introduced into the plasma torch 31. Then, the gas is ignited by the ignition device not shown in the drawings. If the condition of the supplied gas and the condition of the high frequency electric power are appropriate, induction plasma due to the high frequency electric power is generated in the gas flowing into the plasma torch. The microplasma 32 generated in this way is ejected from the plasma nozzle 38.

In the case where the induction coupling type microplasma generating section 34 is employed in the above-described embodiment, the same effect can be attained.

With reference to FIG. 11 and FIGS. 12(*a*) through 12(*e*), explanation will be made on the method for successively performing the embodiments described above. FIG. 11 is a flowchart schematically illustrating the method for successively performing the cleaning process during the bonding process, and FIGS. 12(*a*) through 12(*e*) illustrate the operation of the bonding apparatus conducted in accordance with the flowchart shown in FIG. 11.

At Step S101 shown in FIG. 11, the wire bonding apparatus 10 performs ordinary bonding operation to conduct wire connection between a semiconductor die 14 and a lead frame 15 or a circuit board by. In this process, for example, such as in the case when the number of bonding times reaches a predetermined number e.g. 50 hundred thousands to one million times, when a predetermined time period of the bonding has elapsed, or when it becomes necessary for the capillary tip portion 16*a* to be cleaned in advance for improving resolution in case an image of the tip of the capillary 16 is required to be obtained by a capillary tip image pickup section 46, or when a signal for initiating the cleaning of the capillary tip portion 16*a* is inputted by a manual operation, the control section 71 shifts, at Step 102, its operation from a bonding process mode to a capillary tip cleaning process mode of Step S103 to start the cleaning. The cleaning initiating signal is not limited to the signals such as mentioned above, so far as the operation can be shifted from the bonding process to the cleaning process in accordance with judgment of contamination of the capillary tip portion 16*a* on the basis of analysis of an image of the capillary tip portion 16*a* taken by the capillary tip image pickup section 46 or can be judged by other judging means.

When the operation is shifted to the cleaning process, the control section 71 first outputs to the shutter interface a command for opening the shutter 29 at Step S104. In response to the command, the shutter interface 73 outputs a control signal for opening the shutter 29 to the shutter 29 to open the shutter 29, thereby causing the opening 28 of the cleaning case 27 to appear. With this process, as shown in FIG. 12(*a*), the shutter 29 of the cleaning case 27 is opened under the condition that the bonding arm 13 of the wire bonding apparatus 10 is in the bonding area above the absorbing stage 23.

When the shutter 29 is opened, at Step 105, the control section 71 outputs a command to the moving mechanism interface 91 for shifting the capillary tip to the cleaning position. In response to this command, the moving mechanism interface 91 moves the bonding head 19 horizontally toward the cleaning case 27 by the XY table 20 after outputting a control signal for driving the motor in the bonding head 19 to move the bonding arm 13 to its lifted position as shown in FIG. 12(*b*). The control section 71 obtains from the XY position detecting means interface 93 a position detection signal supplied from the XY position detecting means 25 to watch the position and move the bonding head 19 until the center line 59 of the capillary tip reaches the cleaning position. When it is detected that the capillary tip portion 16*a* has reached the cleaning position, the control section 71 outputs a command to the moving mechanism interface 91*a* to stop the movement of the XY table 20 and lower the capillary 16 as shown in FIG. 12(*c*). In response to the command, the moving mechanism 18 stops the movement of the XY table 20 and starts the lowering of the bonding arm 13 by the motor in the bonding head 19. The height of the capillary 16 is detected by the Z position detecting means 26, and its position signal is inputted to the control section 71 by the Z position detecting means interface 87. The control section 71 outputs a command to the moving mechanism interface 91 to stop the lowering operation of the bonding arm 13 when the control section 71 has judged that the height of the tip of the capillary 16 has reached the cleaning position. In response to the command, the moving mechanism interface 91 stops the lowering of the bonding arm 13.

When the above-mentioned moving process is completed, at Step S106, the control section 71 outputs a command to the shutter interface 73 to close the shutter 29 to the extent that the shutter 29 closes the gap between the capillary 16 and the opening 28. In compliance with the command, the shutter interface 73 closes the shutter 29 so as to leave the cleaning opening.

Next, at Step S107, the control section 71 outputs a command to the gas exhaustion pump interface 77 to drive the gas exhaustion pump 37. In response to the command, the gas exhaustion pump interface 77 drives the gas exhaustion pump 37 and starts exhausting the air and/or gas in the cleaning case 27 out of the cleaning case 27. When the gas exhaustion pump 37 is actuated, the control section 71, at Step S108, outputs a command to the gas valve interface 81 to open the gas valve 39 and a command to the plasma generation power source interface 79 to turn on the plasma generation power source. Each interface 81 and 79 outputs control signals to the gas valve 39 and the power source to open the gas valve 39 and turn on the plasma generation power source. With this operation, gas and electric power is supplied to the microplasma generating section 34, and the gas is ignited by an ignition device (not shown), and ejection of the microplasma 32 to the capillary 16 (bonding tool) is started. FIG. 12(*c*) shows this condition.

When the generation of the microplasma 32 is started, at Step S109, the control section 71 outputs a command to the ultrasonic vibrator interface 89 to start the vibration of the ultrasonic vibrator 21. The ultrasonic vibrator interface 89 starts the vibration of the ultrasonic vibrator 21 in response to this command. Then, the control section 71 counts lapse of predetermined period of cleaning time by a timer or an inner clock at Step S110. When the control section 71 detects that the predetermined time period has lapsed, the commands are outputted to respective interfaces in the order opposite to that of the actuation, and the interfaces stop the ultrasonic vibrator 21, close the gas valve 39, turn off the plasma generation electric power source and stop the gas exhaustion pump 37, at Steps S111 through S113.

At Step S114, the control section 71 outputs a command to the shutter interface 73 to fully open the shutter 29, and the shutter interface 73 fully open the shutter 29 in response to this command.

Figure 12A:
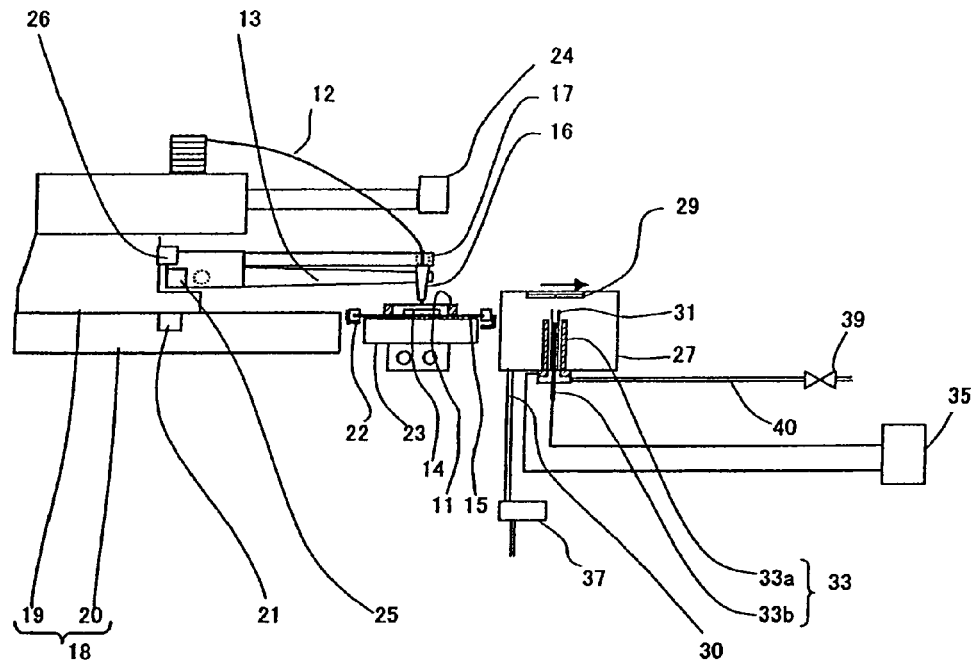
FIGS. 12(a) through 12(e) illustrate a process in which the bonding operation and the cleaning operation are carried out successively in the wire bonding apparatus according to the present invention.
Figure 12B:
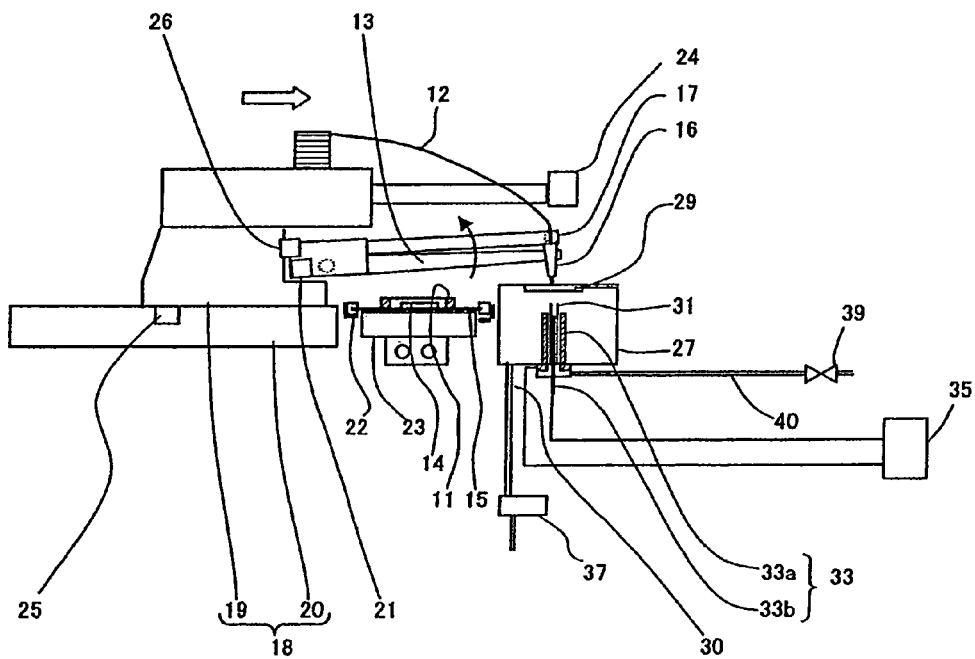
Figure 12C:
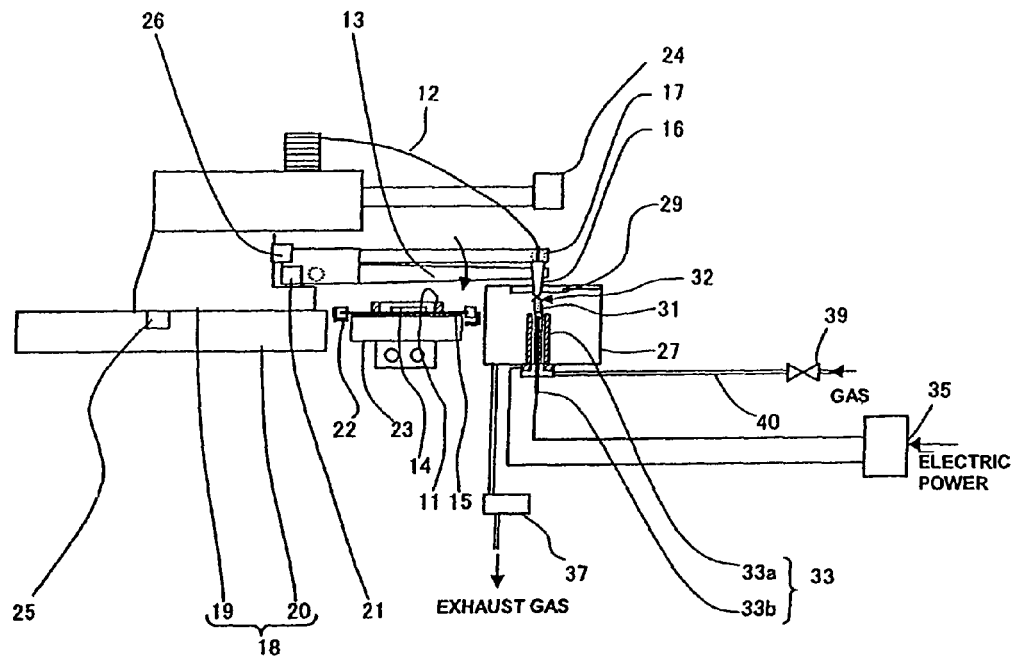
Figure 12D:
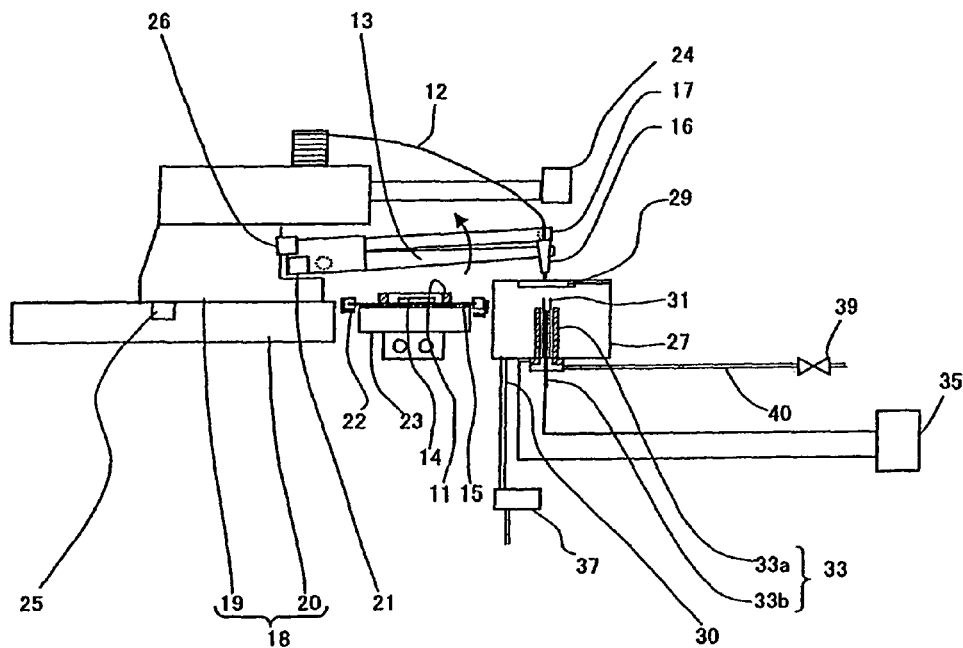
Figure 12E:
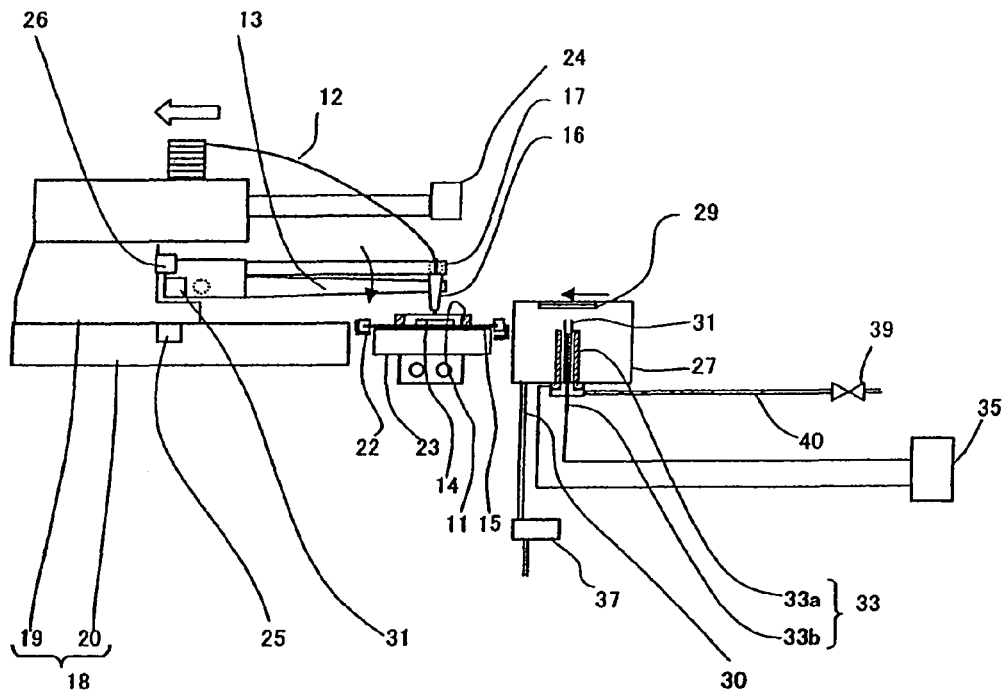
Figure 13:
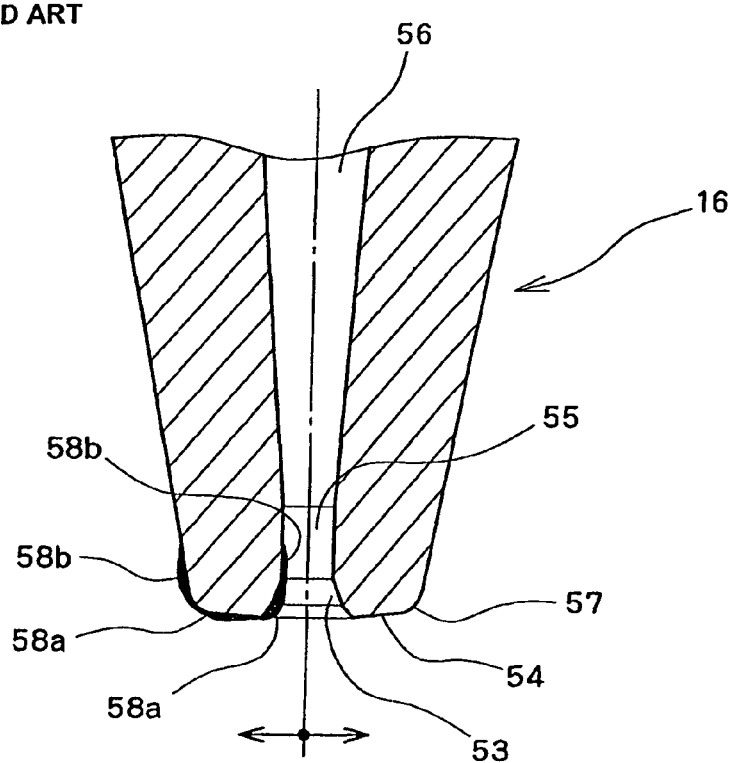
FIG. 13 illustrates a shape of the tip of a capillary and foreign substances attached to the tip of the capillary.
Figure 14A:
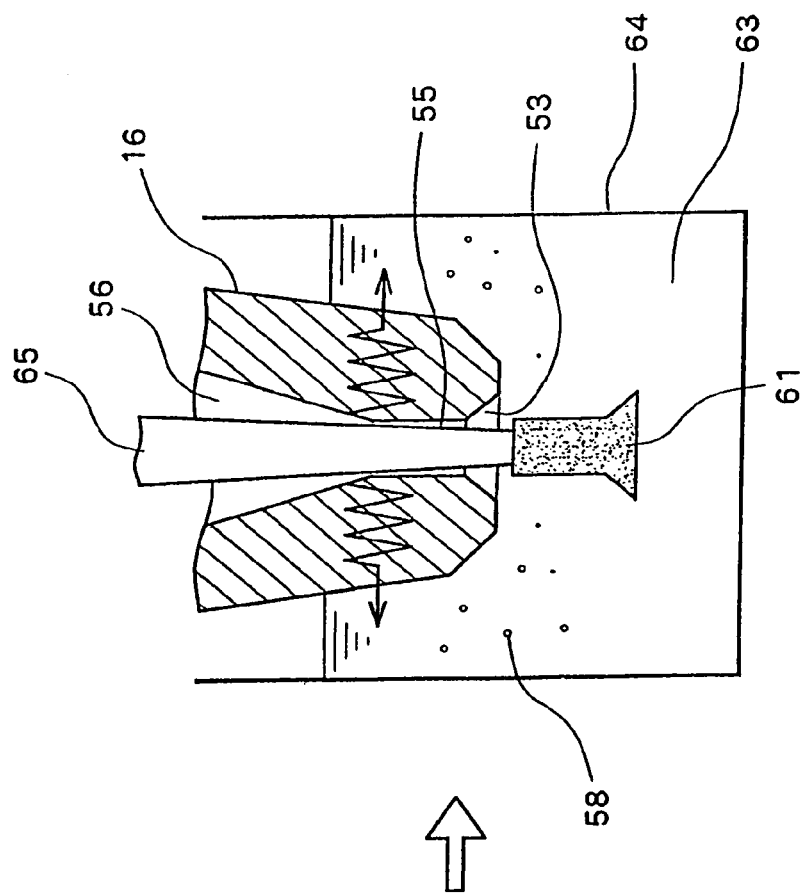
FIGS. 14(a) and 14(b) illustrate a method for cleaning a tip of a capillary by a conventional technology.
Figure 14B:
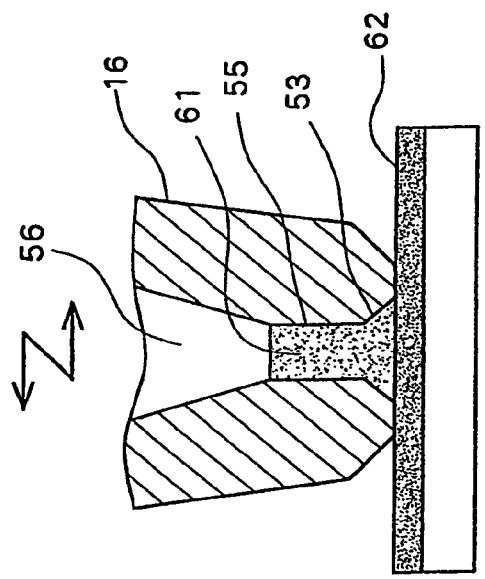

Next, at Step S115, the control section 71 outputs a command to the moving mechanism interface 91 to lift the bonding arm 13. As shown in FIG. 12(d), the moving mechanism interface 91 lifts the bonding arm 13 by the motor in the bonding head 19. Then, the control section 71 outputs a command to the moving mechanism interface 91 to return the capillary tip to the initial bonding area. In response to the command, the moving mechanism 18 starts the movement of the XY table to return the capillary tip to the bonding area. The position of the tip of the capillary 16 is detected by the XY position detecting means 25, and the signal of the detection is inputted to the control section 71. The control section 71 watches the position of the capillary tip referring to the signal and makes the moving mechanism interface 91 to stop the movement of the XY table 20 when the control section 71 determines that the capillary tip has returned to the initial bonding area. The control section 71 outputs a command to the moving mechanism interface 91 to return the capillary 16 to its initial position as shown in FIG. 12(e). In response to the command, the moving mechanism interface 91 actuates the motor in the bonding head 19 to lower the capillary 16. The height of the capillary 16 is detected by the Z position detecting means 26, and the signal of the detection is inputted to the control section 71. The control section 71 makes the moving mechanism interface 91 to stop the lowering of the bonding arm 13 when it determines by the signal of the detection that the capillary 16 has returned to its initial position. When the capillary has returned to its initial position, the control section 71 outputs a command to the shutter interface 73 to close the shutter 29. In response to the command, the shutter interface outputs the control signal to close the shutter 29, thereby closing the shutter 29. When the shutter 29 is closed, the cleaning process is terminated at Step S117.

At Step S118, when the cleaning process is terminated, the control section 71 switches the operation from the cleaning process to the ordinary bonding process and continues the bonding.

As is apparent from the above description, the bonding apparatus of the embodiments are advantageous in that the bonding process and the cleaning process are performed successively, thereby improving the efficiency of bonding. In addition, since the above-described process can be performed along with the bonding control performed by the control section 71, the operation of the bonding apparatus can be automatically switched from the bonding process to the cleaning process so that the wire bonding apparatus 10 is operated successively. Especially, as it is often the case that several tens of wire bonding apparatus 10 are installed and operated together, the automatic successive performance of the bonding process and the cleaning process as described above attains a great deal of saving of labor.

In the above, though the embodiments of the present invention are described with reference to the a wire bonding apparatus, the present invention can be also applied to bump bonding apparatuses which utilize a capillary like in wire bonding apparatuses.

The invention claimed is:

1. A bonding apparatus provided with a bonding tool inserted with a wire to be bonded to a work, the bonding apparatus comprising:
a plasma generating section including a plasma torch with a plasma nozzle thereof directed to a tip of the bonding tool located at a cleaning position, said plasma generating section ejecting plasma state gas from the plasma nozzle and cleaning the tip of the bonding tool; and
a cleaning case for cleaning therein the tip of the bonding tool, the cleaning case having therein the plasma nozzle and being provided with an opening for allowing the tip of the bonding tool to enter the cleaning case there through and an exhaust port for allowing after-cleaning gas to be exhausted there through, wherein
the plasma generating section is a capacitive coupling type microplasma generating, section comprised of a cylindrical outer electrode installed concentrically with a central axis of the plasma torch and an inner electrode installed on the central axis of the plasma torch, and the plasma generating section, upon receipt of a supply of electric power ejects gas having been converted to a plasma state in the plasma torch from the plasma nozzle provided at a distal end of the plasma torch so that the plasma state gas is directed to from below a tip portion of the bonding tool to an outer surface of the tip of the bonding tool.

2. The bonding apparatus according to claim 1, further comprising a shutter for closing a gap between the bonding tool and the opening when the tip of the bonding tool is inserted in the cleaning case through the opening.

3. The bonding apparatus according to claim 1, further comprising a gas exhaustion pump for exhausting the after-cleaning gas from the cleaning case through the exhaust port.

4. The bonding apparatus according to claim 1, wherein the plasma nozzle is provided to eject plasma state gas toward the tip of the bonding tool from a direction making an angle with respect to a longitudinal axis of the bonding tool.

5. The bonding apparatus according to claim 4, wherein the plasma nozzle is provided to rotate around the longitudinal axis of the bonding tool when ejecting the plasma state gas from different angular directions along a circumference of the tip of the bonding tool.

6. The bonding apparatus according to claim 1, further comprising:
a damper opening/closing means for opening and closing each one of a plurality of dampers holding a wire;
a moving mechanism for moving the bonding tool in XYZ directions; and
a bonding computer for controlling a bonding operation of the bonding apparatus and a cleaning operation of the tip of the bonding tool, and the bonding computer includes
a moving means for moving the tip of the bonding tool to the cleaning position in the cleaning case by the moving mechanism, and
a wire length adjusting means for adjusting a length of the wire at the tip of the bonding tool by up/down movement of the bonding tool caused by the clamper opening/closing means and moving mechanism.

7. The bonding apparatus according to claim 1, wherein the plasma generating section is an inductive coupling type microplasma generating section comprised of a high frequency coil wound around the tip of the plasma torch, and the plasma generating section, upon receipt of a supply of electric power, ejects gas having been converted to a plasma state in the plasma torch from the plasma nozzle provided at a distal end of the plasma torch.

8. The bonding apparatus according to claim 1, wherein the bonding computer includes a returning means for returning the tip of the bonding tool to a bonding position above the work by the moving mechanism.

9. A bonding apparatus provided with a bonding tool inserted with a wire to be bonded to a work, the bonding apparatus comprising:
- a plasma generating section including a plasma torch with a plasma nozzle thereof directed to a tip of the bonding tool located at a cleaning position, said plasma generating section electing plasma state gas from the plasma nozzle and cleaning the tip of the bonding tool; and
- a cleaning case for cleaning therein the tip of the bonding tool, the cleaning case having therein the plasma nozzle and being provided with an opening for allowing the tip of the bonding tool to enter the cleaning case there through and an exhaust port for allowing after-cleaning gas to be exhausted there through; and further comprising:
- a vibration applying means for vibrating the tip of the bonding tool; and
- a bonding computer for controlling a bonding operation of the bonding apparatus and a cleaning operation of the tip of the bonding tool; and
- the bonding computer includes
  - a vibration applying and cleaning means for cleaning, within the cleaning case, the tip of the bonding tool by ejecting plasma state gas from a nozzle of the plasma generating section and vibrating the tip of the bonding tool by the vibration applying means.

* * * * *